(12) United States Patent
Virtanen

(10) Patent No.: US 9,135,476 B2
(45) Date of Patent: Sep. 15, 2015

(54) METHOD FOR PRODUCING AN RFID TRANSPONDER BY ETCHING

(75) Inventor: Juhani Virtanen, Tampere (FI)

(73) Assignee: Smartrac IP B.V., Amsterdam (NL)

( * ) Notice: Subject to any disclaimer, the term of this patent is extended or adjusted under 35 U.S.C. 154(b) by 0 days.

(21) Appl. No.: 14/369,231

(22) PCT Filed: Dec. 29, 2011

(86) PCT No.: PCT/FI2011/051167
§ 371 (c)(1),
(2), (4) Date: Jun. 27, 2014

(87) PCT Pub. No.: WO2013/098462
PCT Pub. Date: Jul. 4, 2013

(65) Prior Publication Data
US 2015/0024523 A1    Jan. 22, 2015

(51) Int. Cl.
*G06K 1/12* (2006.01)
*H01L 21/306* (2006.01)
*H01Q 1/38* (2006.01)
*G06K 19/077* (2006.01)
*H01Q 1/22* (2006.01)
*H01J 37/32* (2006.01)
*H05K 3/06* (2006.01)

(52) U.S. Cl.
CPC ............ *G06K 1/12* (2013.01); *G06K 19/07722* (2013.01); *G06K 19/07773* (2013.01); *G06K 19/07786* (2013.01); *H01J 37/3211* (2013.01); *H01J 37/32174* (2013.01); *H01J 37/32889* (2013.01); *H01L 21/306* (2013.01); *H01Q 1/2208* (2013.01); *H01Q 1/38* (2013.01); *H01J 2237/0203* (2013.01); *H01J 2237/3341* (2013.01); *H05K 3/06* (2013.01)

(58) Field of Classification Search
None
See application file for complete search history.

(56) References Cited

U.S. PATENT DOCUMENTS

| | | |
|---|---|---|
| 5,958,647 A | 9/1999 | Morgan |
| 7,927,991 B2 * | 4/2011 | Miyairi et al. ............... 438/584 |
| 2005/0284917 A1 | 12/2005 | Clare et al. |
| 2008/0083715 A1 | 4/2008 | Kirmeier |
| 2008/0120834 A1 | 5/2008 | Laksin et al. |
| 2010/0032199 A1 | 2/2010 | Bentley |

FOREIGN PATENT DOCUMENTS

JP     20010022057 A     1/2001

OTHER PUBLICATIONS

International Search Report; PCT/FI2011/051167; Date mailed Oct. 25, 2012 (5 pages).
Written Opinion of International Searching Authority; PCT/FI2011/051167; Dated mailed Oct. 25, 2012; (7 pages).

* cited by examiner

*Primary Examiner* — Scott B Geyer
(74) *Attorney, Agent, or Firm* — Ziegler IP Law Group, LLC.

(57) ABSTRACT

A method for producing a radio frequency identification transponder includes
providing a conductive sheet covered by a mask layer,
processing the mask layer by a laser beam so as to form an exposed portion of the conductive sheet, wherein the processing is carried out after a radio frequency identification chip has been attached to the conductive sheet, and
etching the exposed portion so as to form a groove in the conductive sheet,
wherein the groove defines an edge of an antenna element of the transponder.

20 Claims, 19 Drawing Sheets

METHOD FOR PRODUCING AN RFID TRANSPONDER BY ETCHING

FIELD

The aspects of the present disclosure relate to RFID transponders.

BACKGROUND

Radio frequency identification (RFID) tags may be attached to items or otherwise associated with items in order to identify the items and/or to track movements of the items. Information stored in the tags may be read in a wireless manner by using a portable or stationary reader.

A radio frequency identification tag comprises a transponder, which responds to an interrogation signal by transmitting a response. The response transmitted from the tag to a reader may contain information, which specifies e.g. an identification number of the item associated with the tag. The tag may be attached to an item by optional attachment means.

RFID tags may be attached to an item in order to provide wireless identification of the item. An RFID tag may specify e.g. a serial number of the item, manufacturing batch of the item and/or a price of the item. An RFID tag may comprise a transponder, which in turn may comprise one or more antenna elements and an RFID chip.

Referring to FIG. 1, the antenna elements 10a, 10b may be produced on a substrate 90 by chemical etching. The substrate 90 may be e.g. PET (Polyethylene terephthalate). After the final shape of the antenna elements 10a, 10b has been etched, an RFID chip 50 may be attached to the antenna elements e.g. by using anisotropically conductive adhesive.

Precise positioning of the contact elements 52a, 52b of the RFID chip with respect to the terminal portions 12a, 12b of the antenna elements 10a, 10b may be required in order to ensure consistent radio frequency performance.

SUMMARY

An aspect of the present disclosure is to provide a method for producing an RFID transponder. Another aspect of the present disclosure is to provide an apparatus for producing RFID transponders. A further aspect of the present disclosure is to provide an RFID transponder.

According to a first aspect of the present disclosure, there is provided a method for producing a radio frequency identification transponder, the transponder comprising a radio frequency identification chip and one or more antenna elements, the method comprising:
   providing a conductive sheet covered by a mask layer,
   processing the mask layer by a laser beam so as to form a processed portion of the conductive sheet, wherein said processing is carried out after the radio frequency identification chip has been attached to the conductive sheet, and
   etching said processed portion so as to form a groove in the conductive sheet,
   wherein said groove defines the position of an edge of an antenna element of the transponder.

According to a second aspect of the present disclosure, there is provided an apparatus for producing a radio frequency identification transponder, the transponder comprising a radio frequency identification chip and one or more antenna elements, the apparatus comprising:
   a holder for holding a conductive sheet covered with a mask layer,
   a laser arranged to form a processed portion of the conductive sheet by processing said mask layer with a laser beam after the radio frequency identification chip has been attached to the conductive sheet, and
   an etching unit arranged to form a groove in the conductive sheet by etching said processed portion, wherein said groove defines an edge of an antenna element of the transponder.

A radio frequency identification (RFID) transponder comprises a radio frequency identification (RFID) chip and one or more antenna elements. The RFID chip is attached to the antenna elements. According to the invention, the antenna elements may be formed by etching from a conductive sheet after the chip has been attached to the conductive sheet.

A method for producing a radio frequency identification transponder (100) may comprise:
   providing a conductive sheet (70) covered by a mask layer (M1, M2),
   processing the mask layer (M1) by a laser beam (LB1) so as to form an exposed portion (U2) of the conductive sheet (70), wherein said processing is carried out after a radio frequency identification chip (50) has been attached to the conductive sheet (70), and
   etching (ETCH1) said exposed portion (U2) so as to form a groove (C2) in the conductive sheet (70),
   wherein said groove (C2) defines an edge of an antenna element (10a) of the transponder (100).

The conductive sheet may be initially covered with a mask layer. The mask layer can be locally removed by a laser beam to form one or more exposed portions where the surface of the conductive sheet will be exposed to an etching chemical. The grooves formed by the subsequent etching coincide with the exposed portions formed by the laser beam.

The material and the thickness of the mask layer may be selected such that the mask layer may be fast and easily removed by using the laser beam. The exposed portions may be formed faster and/or with lower intensity than when cutting through the conductive sheet directly with a high power laser. Furthermore, the risk of damaging the chip with the laser beam may be low when the laser beam is used to remove only the mask layer.

The trajectory of the laser beam may accurately define the position of the antenna element with respect to the chip.

The positions of the edges of the antenna element may be selected by adjusting the trajectory of the laser beam. Thus, the antenna element may be accurately positioned with respect to the chip.

The electrical signals provided by the antenna elements of an RFID tag may be very weak. The impedance of the electrical contact between the chip and the antenna element may be critical. Thanks to the invention, variations in the impedance may be reduced and more consistent and reliable RFID operation may be provided for transponders of a manufacturing batch.

By forming the antenna element after the chip has been attached, deviations in the positioning of the chip may be compensated.

The position of the chip may be detected, and the antenna element may be formed at a location, which is determined based on the detected position of the chip. Thus, a misalignment of the chip may be compensated.

The mask layer may by formed e.g. by spraying or laminating a coating layer onto the conductive sheet. Removing the mask layer locally by the laser beam may be a cheaper method than forming a mask layer by a laser printing process, where the coated region coincides with a region scanned by a laser beam.

Removing the mask layer instead of applying a coating to selected areas may be faster in a situation where the surface area of the coated regions of the conductive sheet is larger than the surface area of the exposed portions. In an embodiment, the surface area of the exposed portion may be e.g. smaller than the surface area of the antenna element defined by said exposed portion, preferably smaller than 20% of the surface area of the antenna element.

Etching may enable mass production of transponders at low costs.

In an embodiment, lower manufacturing costs may be expected.

Thanks to attaching the chip to the conductive sheet before forming the antenna elements, the conductive sheet can be held in place firmly during the attaching. This may help to minimize the adverse effect of chip misalignment.

Transverse forces occurring during the etching process are typically very weak. In an embodiment, the antenna elements of the RFID transponder do not need to be covered with a thick dielectric substrate sheet in order to prevent deformation during the etching (covering with the thick substrate may increase mechanical strength). For example, at least 90% of the area of an antenna element may be covered only with a thin mask layer, wherein the thickness of said mask layer may be e.g. smaller than or equal to 0.2 mm, advantageously smaller than or equal to 0.1 mm, and preferably smaller than or equal to 0.05 mm. This kind of a transponder may be called herein as a "substrateless" RFID transponder.

In an embodiment, a substantially substrateless RFID transponder may be produced.

A substrateless RFID transponder may be subsequently attached to an item, i.e. the surface of the item may be arranged to support the structure of the RFID transponder. A substrateless RFID transponder may also be embedded in an item.

Thanks to the substrateless structure, less waste material may be produced during manufacturing of RFID transponders.

In an embodiment, cheaper face and/or cheaper cover materials may be used in an RFID tag.

Certain issues have to be solved when producing antenna elements which are not attached to a substrate sheet. One of the most challenging issues is maintaining the form and dimensions of the antenna elements when the transponder or a semi-manufactured transponder is rapidly moved. The form of the antenna elements may be maintained e.g. by using links, by using bridges and/or by using suitable holding members.

In an embodiment, the antenna element is connected to an outer portion of a conductive sheet by the links. The links help to maintain the correct form of the antenna element during moving a semi-manufactured transponder. The antenna element may be subsequently separated from the remaining portion of the conductive sheet, e.g. by breaking the links.

In an embodiment, dimensions and/or shapes of the antenna elements produced by a manufacturing apparatus may be rapidly changed.

In an embodiment, a plurality of semi-manufactured (i.e. not yet finished) transponders comprising a chip attached to a conductive sheet may be stored, and the final form of the antenna elements may be formed e.g. after several hours or several days after the chips have been attached to the sheet. This may improve the speed at which the manufacturing process may be adapted to rapidly produce transponders having different antenna shapes. A plurality of semi-manufactured transponders may be stored e.g. as a roll, which comprises several chips attached to the same substantially continuous conductive sheet.

BRIEF DESCRIPTION OF THE DRAWINGS

In the following examples, the embodiments of the invention will be described in more detail with reference to the appended drawings, in which.

DETAILED DESCRIPTION

Figure 1:
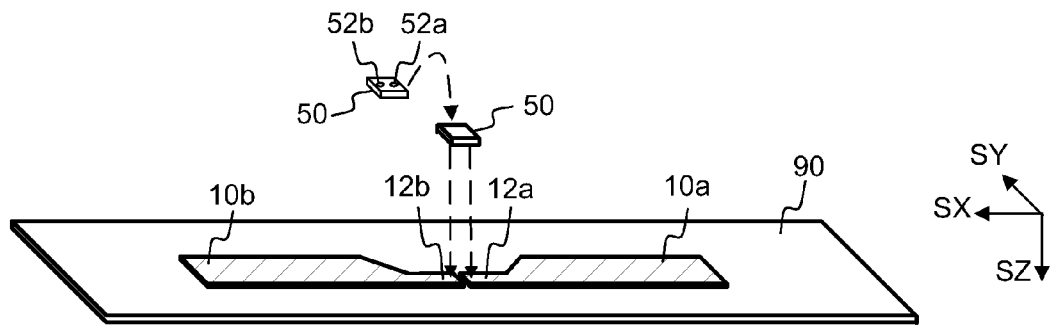
FIG. 1 shows, in a three dimensional view, a known method for manufacturing an RFID tag.
Figure 2:
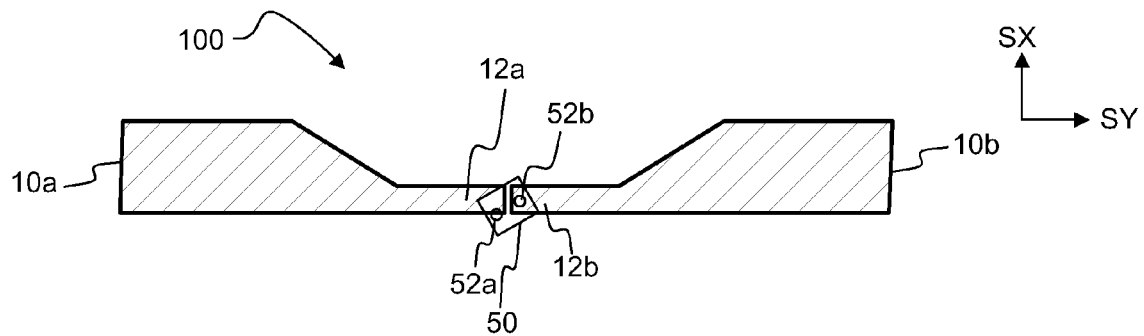
FIG. 2 shows, in a top view, misalignment of an RFID chip with respect to antenna elements.

Referring to FIG. 2, a radio frequency identification chip 50 may be misplaced
with respect to antenna elements 10a, 10b in a situation where the antenna elements 10a, 10b have been formed before bonding the contact elements 52a, 52b of the chip 50 to the terminal portions 12a, 12b of the antenna elements 10a, 10b.

SX, SY, and SZ denote orthogonal directions. The conductive sheet 70 may be (substantially) in a plane defined by the directions SX and SY. The direction SZ may be substantially perpendicular to the plane of the conductive sheet.

The electrical signals provided by the antenna elements of an RFID tag may be very weak. Angular and/or translational misalignment of the chip 50 may have an adverse effect on the impedance of the electrical contact between the chip 50 and the antenna elements 10a, 10b. The chip 50 may be so severely displaced with respect to the correct position that it prevents operation of the transponder 100.

Figure 3:
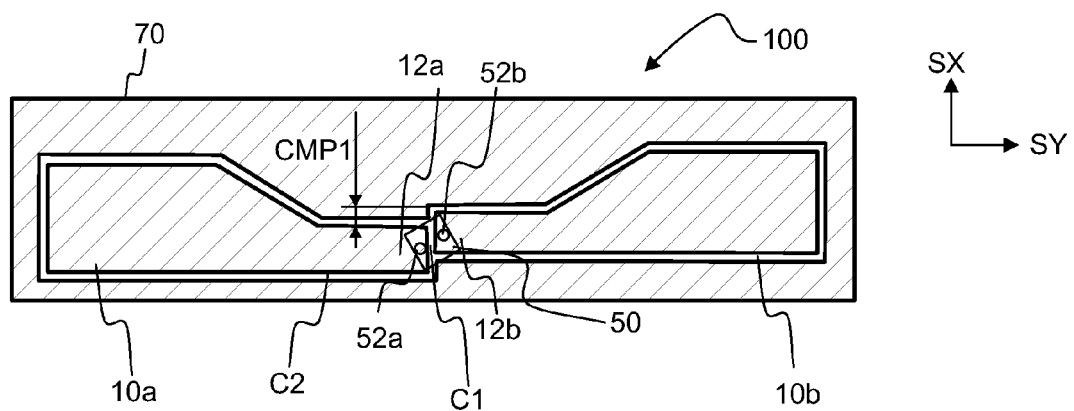
FIG. 3 shows, in a top view, defining the edges of an antenna element by etching in order to compensate misalignment of the RFID chip.

Referring to FIG. 3, the error in the position of the chip 50 may be at least partly compensated by forming at least a portion of an antenna element 10a, 10b after the chip 50 has been attached to the conductive material of the antenna elements 10a, 10b. For example, the terminal portion 12a of a first antenna element 10a may be displaced by a distance CMP1 with respect to the terminal portion 12b of a second antenna element 10b in order to compensate the misalignment of the chip 50.

The position of an edge of the terminal portion 12a may be selected so as to compensate the misalignment of the chip 50. The position of the edge of the terminal portion 12a may be defined by a groove C1 and/or by a groove C2.

C1 denotes a groove, which overlaps the chip 50. C2 denotes a groove which does not overlap the chip 50.

The contact elements 52a, 52b of an RFID chip 50 may be bonded to the conductive sheet 70 before the terminal portions 12a, 12b of the antenna elements 10a, 10b are formed by etching.

The conductive sheet 70 may comprise e.g. aluminum (Al), copper (Cu), nickel (Ni), tin (Sn), iron (Fe), or silver (Ag). Environmentally friendly low-cost materials may be preferred. In particular, the conductive sheet 70 may consist of aluminum or copper. The thickness of the conductive sheet 70 may be e.g. in the range of 0.002 mm to 0.02 mm, in the range of 0.02 mm to 0.08 mm, or in the range of 0.08 mm to 0.2 mm.

The contact elements 52a, 52b of the chip 50 may comprise e.g. copper, aluminum, tin, silver, nickel, and/or gold.

The contact elements 52a, 52b may be contact bumps. The contact elements 52a, 52b may be contact pads.

The RFID chip 50 may comprise more than two contact elements 52a, 52b. In particular, the RFID chip 50 may have four contact elements. In particular, two contact elements may be bonded to the same antenna element in order to provide more reliable electrical contact and/or in order to provide mechanically stronger connection.

The longest dimension of the chip 50 may be e.g. smaller than or equal to 5 mm, preferably smaller than 2 mm.

Figure 4A:
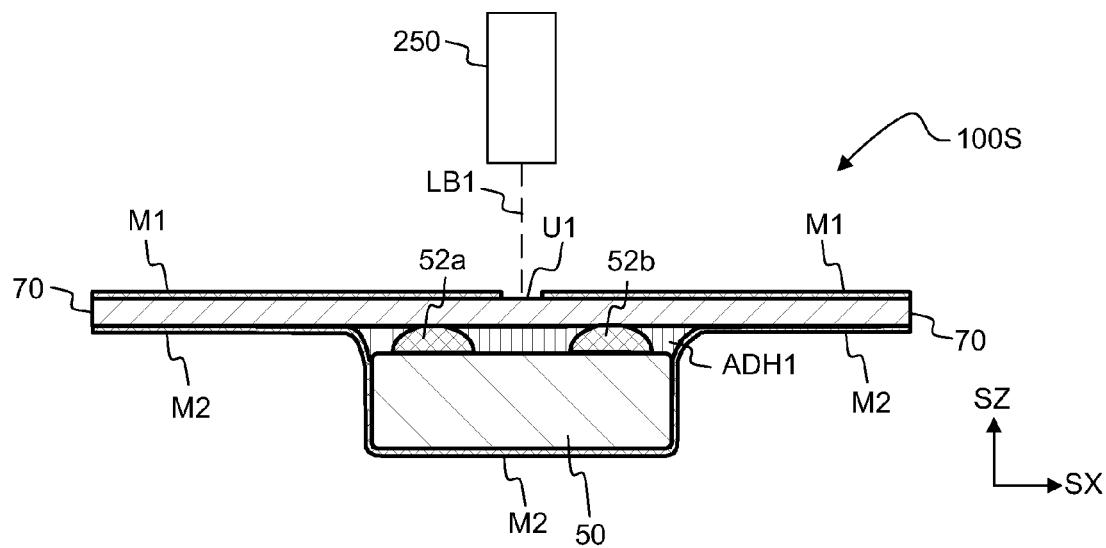
FIG. 4a shows, in a cross-sectional side view, removing a mask layer locally by a laser beam.
Figure 4B:
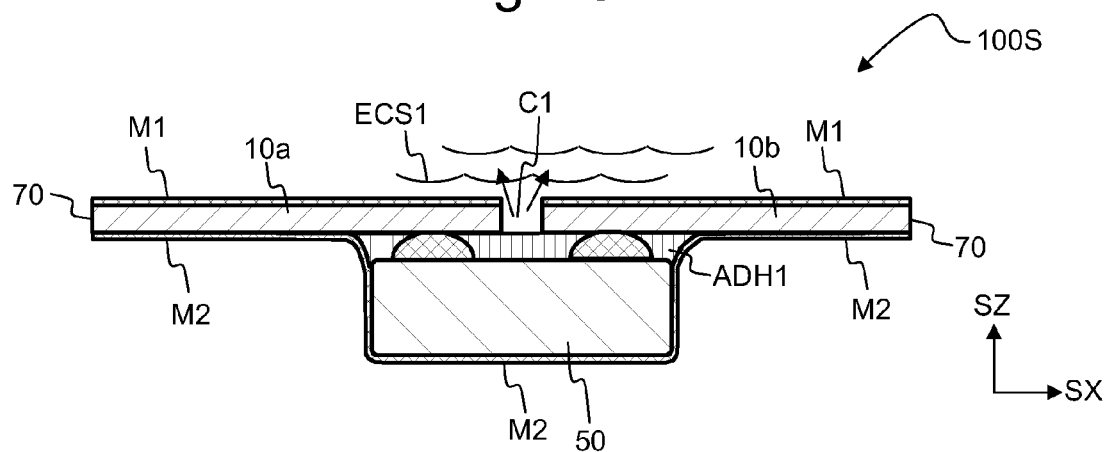
FIG. 4b shows, in a cross-sectional side view, etching a groove in a conductive sheet.
Figure 4C:
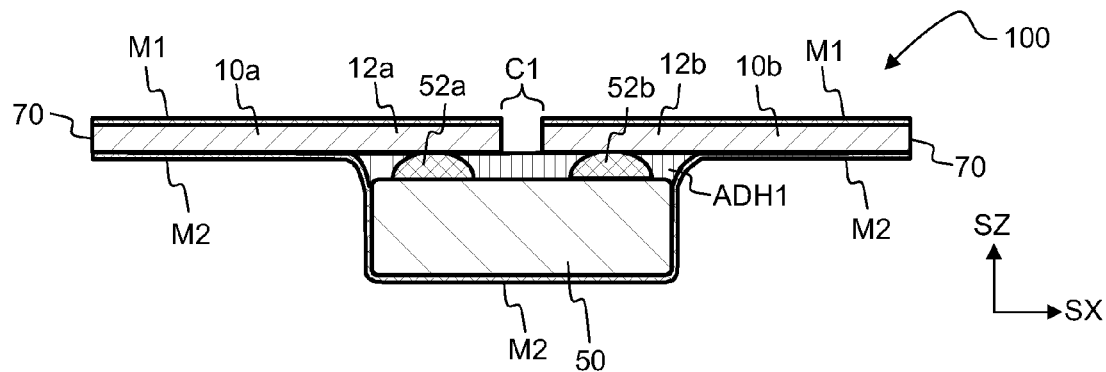
FIG. 4c shows, in a cross-sectional side view, a groove etched in the conductive sheet.

FIGS. 4a-4c show steps for forming one or more grooves C1 (and/or for forming grooves C2) in a conductive sheet 70. A semi-manufactured transponder 100S may comprise an RFID chip 50 attached to a conductive sheet 70. The contact elements 52a, 52b of the chip 50 may be bonded to the conductive sheet 70 e.g. by welding, soldering and/or by anisotropically conductive adhesive ACP1.

A first side of the sheet 70 may be covered with a first mask layer M1. A second side of the sheet 70 may be covered with a second mask layer M2.

The mask layer M1 and/or M2 may be e.g. a polymer layer, which has been laminated or sprayed onto the surface of the conductive sheet.

The material of the mask layer M1 and/or M2 may be selected such that the mask layer substantially prevents erosion of the sheet 70 beneath the mask layer during the etching. The mask layer M1 and/or M2 may comprise e.g. polyethylene terephthalate.

The material of the mask layer M1 may be selected such that the mask layer may be locally processed by using a laser beam LB1. The mask layer may be locally processed by using a laser beam LB1 such that the mask layer M1 becomes locally permeable to the etching substance ECS1. Said processing may include e.g. heating, melting, evaporation, burning, ablation, chemical transformation and/or swelling of the mask layer M1 with the energy of the laser beam LB1.

Processing with the laser beam LB1 may substantially completely remove the mask layer M1 from the portion U1 (and/or U2) so that the (conductive) surface of the sheet 70 becomes visible. However, this is not always necessary. Instead of complete removal of the mask layer, the portion U1 (and/or U2) may also be formed by converting a dense mask layer M1 locally to a porous and/or fractured structure, which is permeable to the etching substance ECS1. Thus, the mask layer may be completely removed from the processed portion U1,U2 or the processed portion U1,U2 may be covered with a converted material layer, which does not prevent removal of material from the underlying sheet 70 during the etching.

The term "exposed portion U1" may have the same meaning as the term "processed portion U1". The term "exposed portion U2" may have the same meaning as the term "processed portion U2".

U1 denotes an exposed portion, which overlaps the chip 50. U2 denotes an exposed portion which does not overlap the chip 50.

Only selected portions of the mask layer are processed by the laser beam LB1. The portions U1, U2 are processed locally, which means that a considerable area of the mask layer M1 remains substantially impermeable to the etching substance ECS1 after said processing. For example, more than 50% of the (one-sided) area of the conductive sheet 70 (on the laser-processed side of the sheet 70) may remain covered by the substantially impermeable mask layer M1 after said processing The mask layer M1 may comprise a dye, which effectively absorbs energy at the wavelength of the laser beam LB1.

Processing the mask layer M1 at the exposed portions U1, U2 by the laser beam LB1 may be a faster operation than direct cutting of the sheet 70 with a high power laser beam.

Processing the mask layer M1 at the exposed portions U1, U2 by the laser beam LB1 may be carried out by using a lower intensity and/or laser power than direct cutting of the sheet 70 with a high power laser beam.

In particular, the temperature of the conductive sheet 70 (at the chip side) may be kept lower than 300° C., advantageously lower than 200° C., and preferably lower than 150° C. during the processing.

The risk of damaging the chip 50 with the processing laser beam LB1 may be substantially lower than in a situation where the sheet 70 is directly cut with a high power laser beam.

The laser beam LB1 is provided by a laser 250. The laser 250 may be e.g. an excimer laser, a semiconductor laser, a carbon dioxide laser or a YAG-laser.

The second mask layer M2 may optionally cover also the chip 50 and/or the sides of the adhesive layer ADH1, in addition to covering the sheet 70. When covering the sheet 70 of the semi-manufactured transponder 100S with the mask layer M2, it might be easier to cover also the chip 50 than to leave the chip 50 locally without the mask layer M2.

Referring to FIG. 4b, the material of the conductive sheet 70 may be locally removed from the exposed portions U1 by an etching substance ECS1. The material of the conductive sheet 70 may be locally removed by an etching substance ECS1 so as to form one or more grooves C1. The material of the conductive sheet 70 may be locally eroded by the etching substance ECS1. The location of a groove C1 may match with the location of the exposed portion U1 shown in FIG. 4a. The groove C1 shown in FIG. 4c may coincide with the exposed portion U1 shown in FIG. 4a.

The etching substance ECS1 may be in liquid form. A copper foil may be etched e.g. by using aqueous ferric chloride solution. An aluminum foil may be etched e.g. by using aqueous sodium hydroxide solution. Using the etching substance ECS1 in liquid form may provide a fast and cost-effective method for forming grooves in the sheet 70. Materials dissolved and/or chemically bound in the liquid substance ECS1 may be rather easily recycled.

The etching substance ECS1 may be heated to increase the etching speed. The unit of the etching speed may be e.g. $g \cdot m^{-2} s^{-1}$. (i.e. grams per unit surface area per unit time) or $m \cdot s^{-1}$ (unit length per unit time).

The etching substance ECS1 may also be in a gaseous form. The grooves may be formed by using plasma etching.

In an embodiment, the reverse side of the sheet 70 may also be left without the mask layer M2 during the etching. Erosion of the reverse side of the sheet 70 may be prevented or reduced by other means. For example, the reverse side of the sheet 70 may be flushed with a protective liquid in order to reduce or prevent erosion of the reverse side of the sheet 70.

FIG. 4c shows a groove C1 etched in the conductive sheet 70. The grooves C1 preferably extend through the conductive sheet. The grooves C1 may also be called as slits or slots.

Residual etching substance ECS1 remaining on the sheet 70 may corrode the transponder 100. Residual etching substance ECS1 may cause time-dependent drifting of coupling impedance. Residual etching substance ECS1 may degrade the visual appearance and/or may leave the surface of the sheet 70 sticky.

The groove C1, C2 and/or the transponder 100 may be optionally washed after the etching in order to remove residual etching substance ECS1.

Alternatively or in addition to washing, the residual etching substance ECS1 may also be removed (blown away or sucked away) by a gas jet.

Alternatively or in addition to washing, the residual etching substance ECS1 may also be neutralized or inactivated by adding a suitable chemical substance.

The transponder 100 may be optionally dried after a washing step.

Figure 5A:
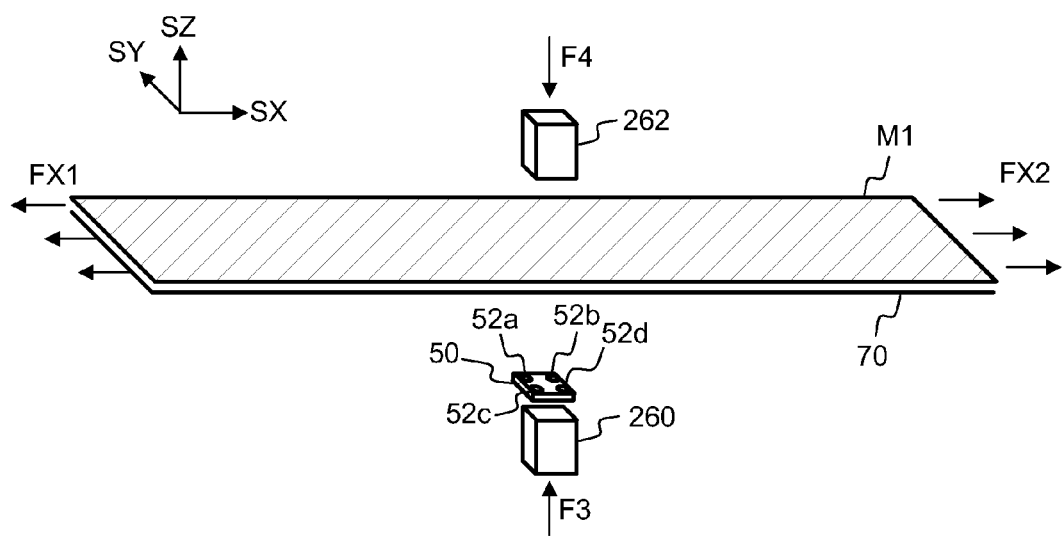
FIG. 5a shows, in a three dimensional view, attaching an RFID chip to a conductive sheet covered by a first mask layer.

FIG. 5a shows attaching the chip 50 onto the conductive sheet 70 by using a compressing force F3 generated by a chip holder 260. A counter force F4 may be simultaneously generated by a backing support 262. The sheet 70 may be held in place by tensioning forces FX1, FX2 during attaching the chip 50.

One side of the sheet 70 may be covered with a mask layer M1 before attaching the chip 50. Before the attaching, the other surface of the sheet 70 (i.e. the chip side) should be at least locally exposed at the locations, which will be in contact with the contact elements 52a, 52b, 52c, 52d.

Figure 5B:
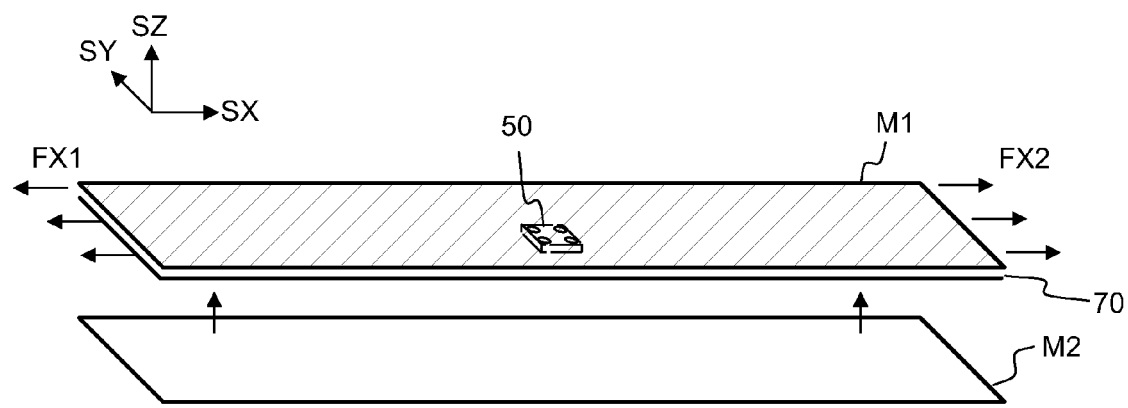
FIG. 5b shows, in a three dimensional view, applying a second mask layer on the conductive sheet.

FIG. 5b shows attaching the second mask layer M2 to the conductive sheet 70. The second mask layer M2 may be applied e.g. by laminating a protective layer to the sheet 70 or by spraying a lacquer to the sheet 70. For example, the laminating may comprise applying a polymer film by using compressive rolls and/or heating. For example, a UV-curable lacquer may be sprayed on the sheet 70. The lacquer may be cured by ultraviolet light.

Figure 5C:
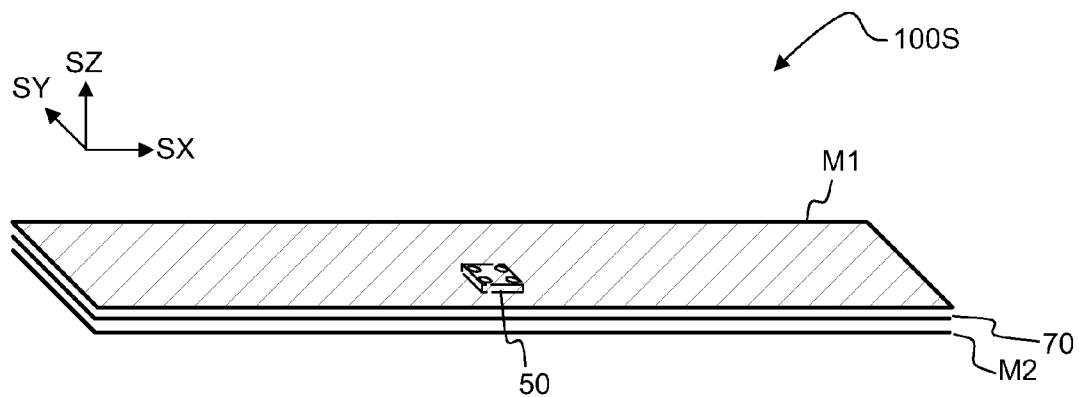
FIG. 5c shows, in a three dimensional view, an RFID chip attached to the conductive sheet.

FIG. 5c shows a semi-manufactured transponder 100S comprising the chip 50, and the conductive sheet 70, wherein the sides of the sheet 70 are protected by the mask layers M1, M2.

Several chips 50 may be attached to the same conductive sheet 70, i.e. several semi-manufactured transponders 100S may be joined together at this stage.

The encapsulation of the chip 50 may be exposed, or the chip 50 may be covered with a mask layer M2.

Figure 5D:
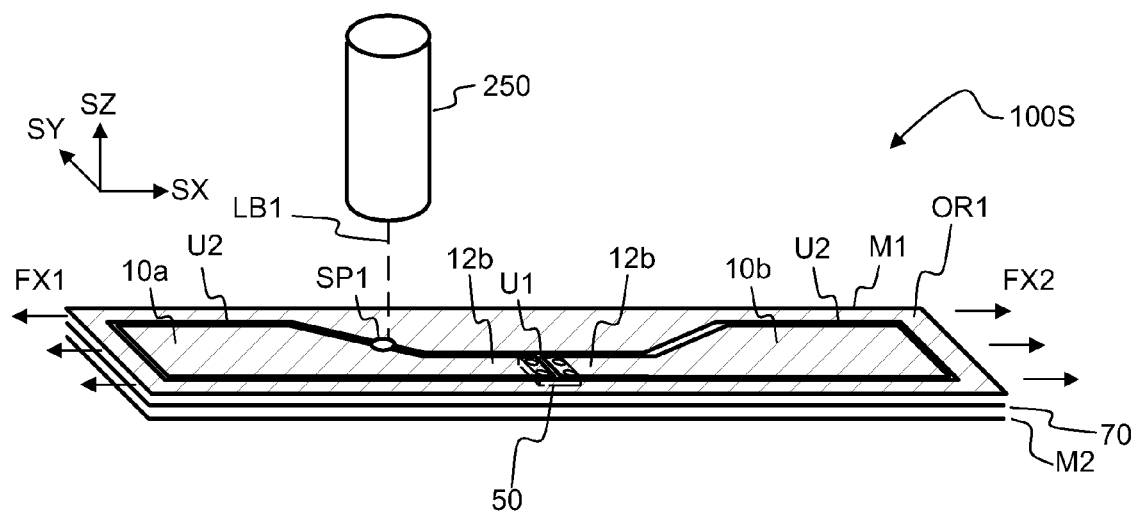
FIG. 5d shows, in a three dimensional view, removing the first mask layer locally by using a laser beam.

Referring to FIG. 5d, exposed portions U1, U2 may be formed by using one or more laser beams LB1 to locally process the mask layer M1, M2. SP1 denotes a laser spot. U1 denotes an exposed portion, which overlaps the chip 50. U2 denotes an exposed portion which does not overlap the chip 50.

The processed portions U1, U2 may define the form of one or more antenna elements 10a, 10b. In particular, the portions U1, U2 may define the edges of a terminal portion 12a, 12b of an antenna element 10a, 10b.

OR1 denotes an outer portion. The outer portion OR1 may surround the antenna elements 10a, 10b.

Figure 5E:
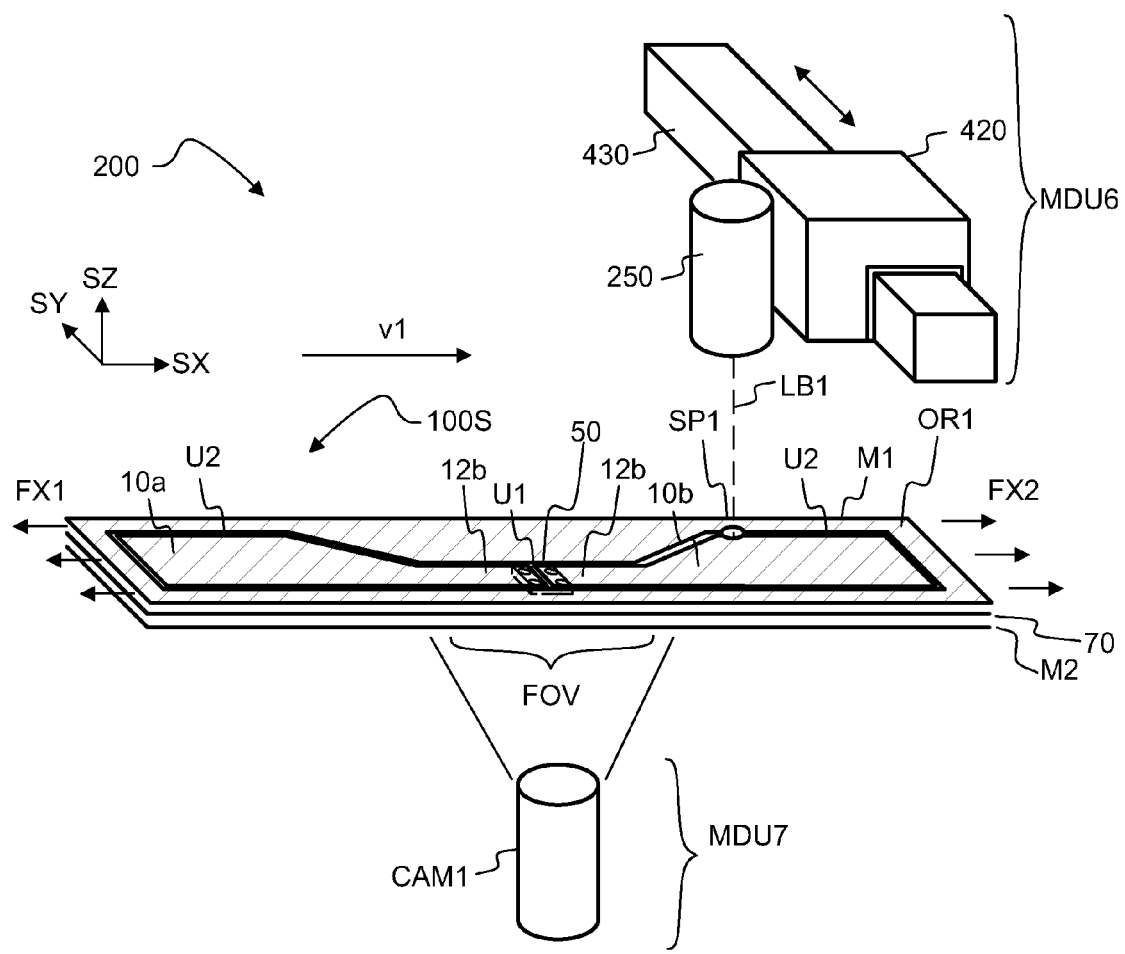
FIG. 5e shows, in a three dimensional view, an apparatus for locally processing the first mask layer.

FIG. 5e shows an apparatus 200 comprising a laser processing unit MDU6. The laser processing unit MDU6 may be arranged to locally process the mask layer M1 with a laser beam LB1. In particular, the mask layer M1 may be locally removed by the laser beam LB1.

The apparatus 200 may optionally comprise a monitoring unit MDU7 to detect the position of the chip 50. The position of the chip 50 may be monitored by using the monitoring unit MDU7. The monitoring unit MDU7 may comprise e.g. a camera CAM1, which has a field of view FOV.

The manufacturing of the transponder 100 may comprise detecting the position of the chip 50 after the chip 50 has been attached, and selecting the position of an exposed portion U1 and/or U2 based on the detected position of the chip 50.

Information provided by the monitoring unit MDU7 may be used for controlling the position, power and/or scanning speed of the laser beam LB1. Scanning speed means the relative velocity of the spot SP1 of the laser beam LB1 with respect to the conductive sheet 70.

The laser processing unit MDU6 may further comprise a beam steering unit. During forming the exposed portions U1, U2, the spot SP1 of the laser beam LB1 may be moved with respect to the conductive sheet 70 e.g. by a beam steering unit. For example, the beam steering unit may comprise a translation stage. A laser 250 may be attached to a translation unit 420, which may be arranged to move along a guide 430 in the direction SY. The beam steering unit may also comprise a second translation stage for moving the laser 250 in the direction SX. However, the second translation stage may be omitted if the conductive sheet 70 is moved in the direction SX e.g. by a pair of rollers. The conductive sheet may be moved e.g. at a velocity v1 with respect to the laser spot SP1. The beam steering unit may comprise e.g. one or more movable mirrors, prisms, lenses, diffractive elements and/or masks for changing the position of the laser spot SP1 on the conductive sheet 70. In other words, it is not necessary to move the laser 250. The beam LB1 may be stationary and the sheet 70 may be moved. Both the beam and the sheet may be moved. Several laser beams may be used for forming several exposed portions U1, U2 substantially simultaneously.

Figure 5F:
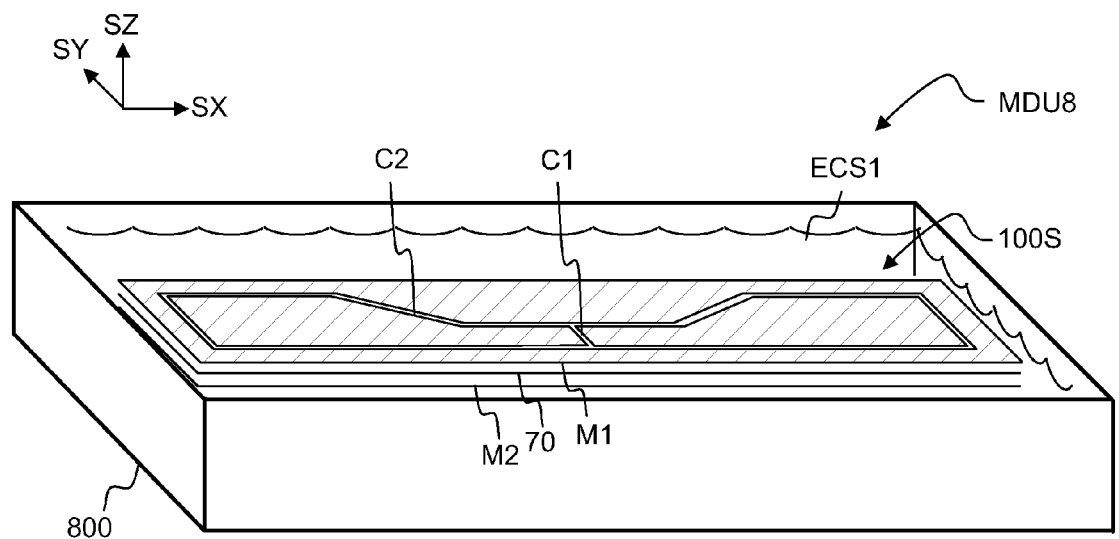
FIG. 5f shows, in a three dimensional view, etching one or more grooves in the conductive sheet.

FIG. 5f shows a semi-manufactured transponder 100S immersed in an etching substance ECS1. The manufacturing apparatus 200 may comprise an etching unit MDU8. The etching unit MDU8 may comprise a vessel 800, which in turn contains an etching substance ECS1. The etching substance ECS1 may be e.g. in liquid form.

Grooves C1, C2 may be formed as the material of the conductive sheet 70 is locally eroded from the exposed portions U1, U2. The material may be eroded by a chemical reaction and/or dissolution caused by the etching substance ECS1. The grooves C1, C2 may coincide with the exposed portions U1, U2 formed by the laser beam LB1.

Figure 5G:
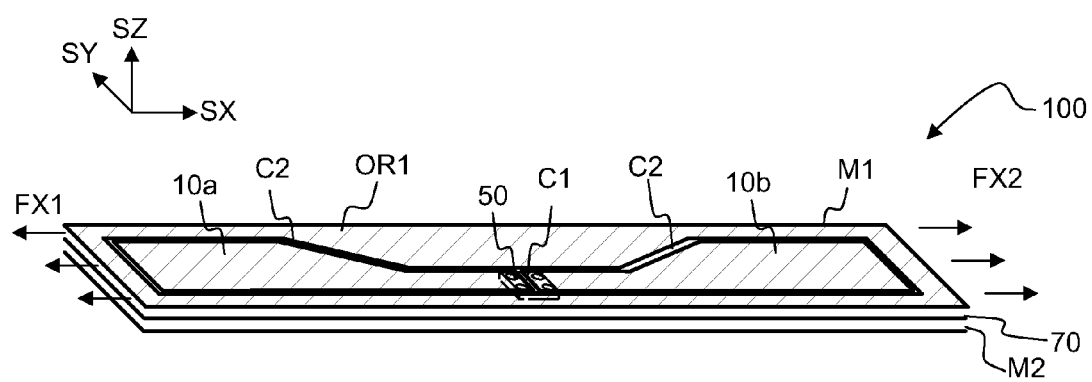
FIG. 5g shows, in a three dimensional view, a transponder comprising antenna elements formed by etching.

FIG. 5g shows a transponder 100, wherein the edges of the antenna elements 10a, 10b are defined by the grooves C1, C2.

At this stage, an electrically conductive outer portion OR1 may surround one or more of the antenna elements 10a, 10b of the transponder 100. The outer portion OR1 may form an electrically conductive loop, which may disturb the operation of the transponder 100. It may be advantageous to remove or eliminate the outer region OR1. The outer region OR1 may be e.g. stripped away from the transponder 100. The transponder 100 may be stripped away from the outer region OR1. The outer region OR1 may be etched away. One or more grooves may be formed in the outer region OR1 so as to break the conductive loop. A first transponder and a second adjacent transponder 100 may be formed on the same conductive sheet 70 such that an outer region OR1 does not surround the first transponder 100. A groove C2 may be etched such that the outer region OR1 is not formed at all.

Figure 5H:
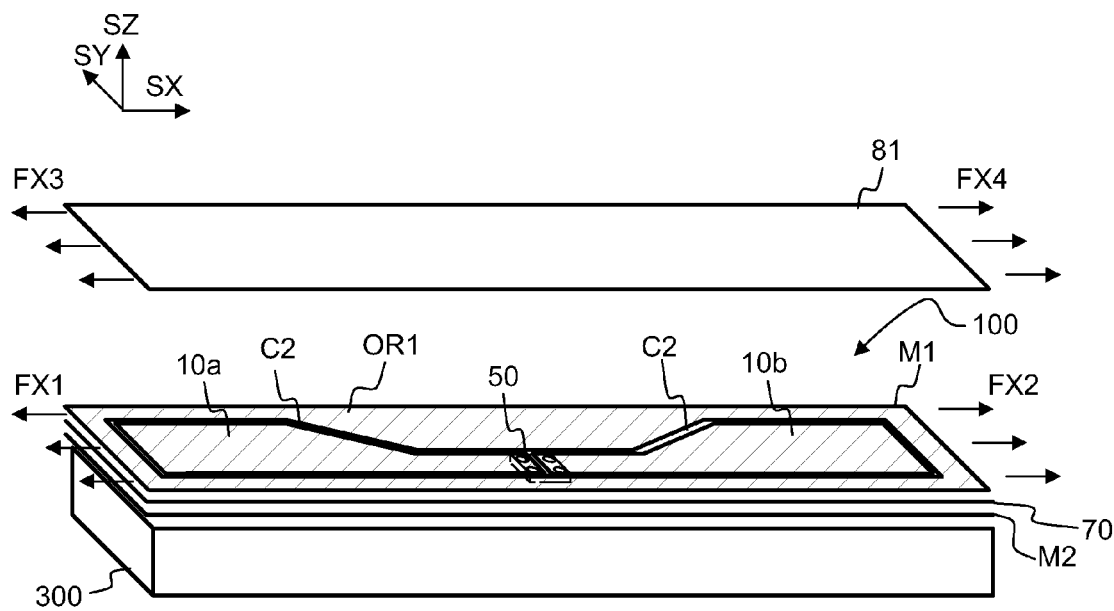
FIG. 5h shows, in a three dimensional view, a carrier sheet and a transponder.

Referring to FIG. 5h, a carrier sheet 81 may be brought close to the transponder supported on the holder 300. The carrier sheet 81 may be held in the correct position e.g. by tensioning forces FX3, FX4.

At this stage, one or more grooves C2 separating the transponder 100 from the outer portion OR1 may have been formed. However, the transponder 100 is still in the same plane with the outer portion OR1, and the transponder 100 may be mechanically tied to the outer portion OR1 (or to an adjacent transponder 100) by the mask layer M2.

The transponder 100 may be moved away from the outer portion OR1 e.g. by a method comprising applying an adhesive selectively on the antenna elements 10a, 10b but not on the outer portion OR1. When the carrier sheet 81 is brought to contact with the transponder 100, the transponder 100 may be adhered to the carrier sheet 8, and the transponder 100 may be moved away from the outer portion OR1 together with the carrier sheet 81.

Alternatively or in addition, an adhesive may be applied selectively only on those portions of the carrier sheet 81 which will be in contact with the antenna elements 10a, 10b. Those portions of the carrier sheet 81, which coincide with the outer portion OR1 and with the groove C2 may be left without the adhesive.

The adhesive used for fixing the transponder 100 to the carrier sheet 81 may be e.g. a pressure-sensitive adhesive or a hot-melt adhesive.

The adhesive force of the adhesive may be so high that also the second mask layer M2 can easily be broken when the transponder 100 is lifted together with the carrier sheet 81. The tensile strength of the conductive sheet 70 may be higher than the tensile strength of the mask layer M2.

Figure 5I:
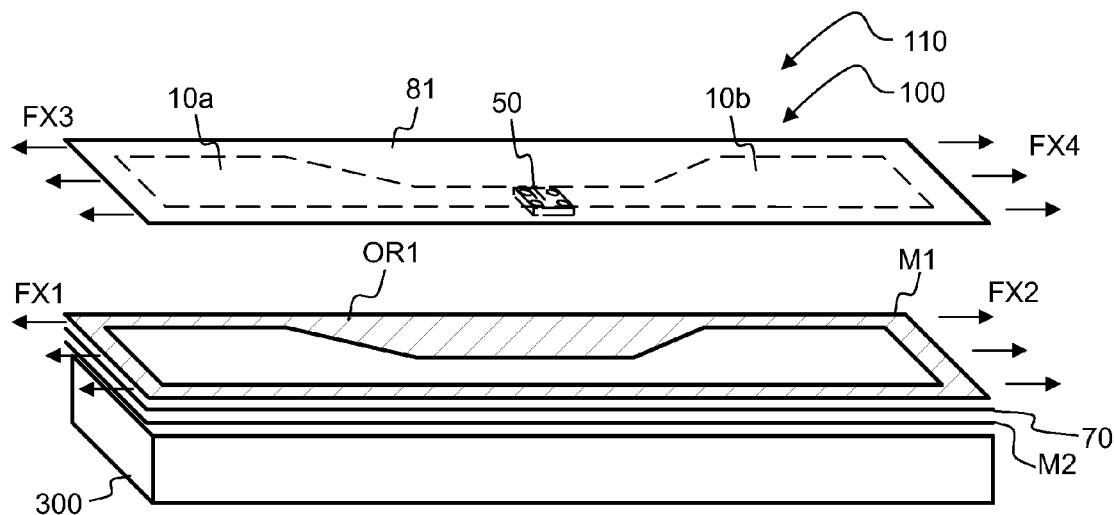
FIG. 5i shows, in a three dimensional view, a transponder attached to a carrier sheet.

Referring to FIG. 5i, the transponder 100 may be moved away from the outer portion OR1 by using the carrier sheet 81 as a holding means. In particular, the transponder 100 may be displaced together with the carrier sheet 81 to a level which is different from the level of the outer region OR1. The carrier sheet 81 may be held and moved to the desired position e.g. by using tensioning forces FX3, FX4. Once the carrier sheet 81 has been adhered to the transponder 100, the carrier sheet 81 may stabilize the positions of the antenna elements 10a, 10b with respect to each other such that the transponder 100 withstands e.g. lifting and rapid movements.

The material of the second mask layer M2 may be selected such that the second mask layer M2 may be broken with a relatively low mechanical force.

The thickness and/or the material of a mask layer M2 may be selected such that the tensile strength of the mask layer M2 is smaller than the tensile strength of the conductive sheet 70.

Breaking of the second mask layer M2 may be assisted e.g. by using one or more cutting blades, by heating the transponder 100 such that the strength of the mask layer M2 is degraded, by using a solvent which removes the mask layer M2, and/or by laser cutting.

The holder (i.e. holding means) 300 may have a substantially planar form (as shown in the figures), or it may have a curved surface. In particular, the holder 300 may be a roll. In particular, the holder 300 may be rotating roll, wherein the conductive sheet 70 may be pulled against a curved surface of the holder 300 e.g. by tensioning forces FX1, FX2. The conductive sheet 70 may also be pressed against the holder 300 by one or more auxiliary (rotating) rolls or (sliding) pressing units.

During the manufacturing, the combination of the chip 50 and the conductive sheet 70 (i.e. a semi-manufactured transponder 100S) may be supported by a holding member 300.

The transponder 100 may be held by the holding member 300 when the outer portion OR1 is separated from the transponder 100. The transponder 100 may be held by a pressure difference.

The outer portion OR1 may be held by the holding member 300 when the outer portion OR1 is separated from the transponder 100. The outer portion OR1 may be held by a pressure difference.

The holding member 300 or holder 300 may comprise e.g. a plurality of holes (not shown) for pulling the conductive sheet 70 against the holder 300 by a pressure difference ("vacuum"). The holes may be connected to a low-pressure unit (not shown). The pressure difference VAC1 ("vacuum") created by the holes may fasten the antenna elements 10a, 10b firmly against the surface of the holding member 300.

The low pressure unit may be a pump (not shown). In particular, the low pressure unit may comprise a suction pump and a vacuum tank to provide a substantially constant low pressure, and one or more valves for switching the low pressure (vacuum) in the holes on and off.

The holding member 300 may have a curved holding surface. In particular, the holding member 300 may be a roll, which comprises a plurality of holes connected to a low-pressure unit. The sheet 70 may be held against the surface of the roll by pressure difference. The roll may be called e.g. as a "vacuum roll" or a "suction roll". In particular, the roll-shaped holding member 300 may be used in roll-to-roll processing.

Figure 6A:
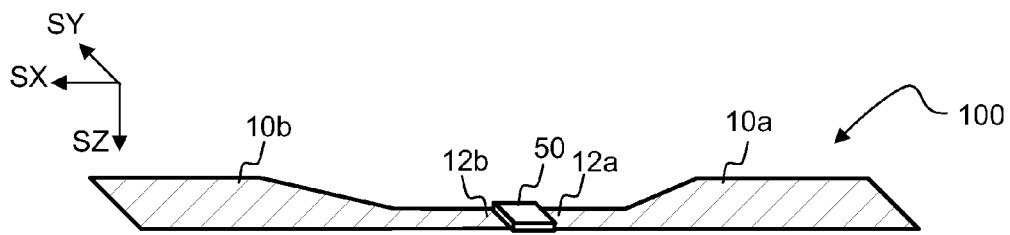
FIG. 6a shows, in a three dimensional view, a substrateless RFID transponder.

FIG. 6a shows a free-standing substrateless RFID transponder 100 comprising one or more antenna elements 10a, 10b, and a chip 50.

A transponder 100 may be attached to a carrier sheet so as to provide an RFID tag.

Figure 14:
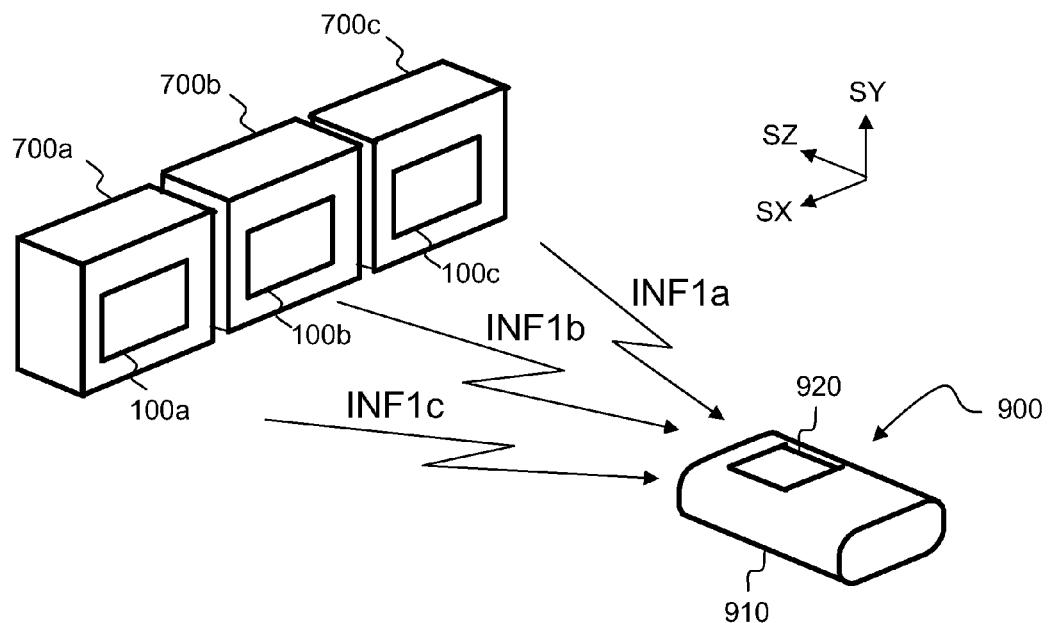
FIG. 14 shows, in a three dimensional view, RFID transponders attached to items.

Alternatively, the RFID transponder 100 may be directly attached to an item 700a (See FIG. 14). The item 700a may be e.g. a cardboard box or a battery for an electronic device. The RFID transponder 100 may be attached to a surface of the item 700a or the RFID transponder 100 may be embedded in the item 700a.

Figure 6B:
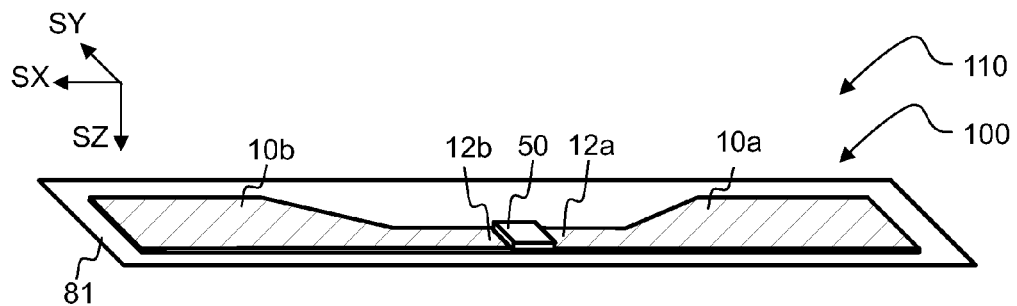
FIG. 6b shows, in a three dimensional view, an RFID transponder attached to a carrier sheet.

FIG. 6b shows a transponder 100 attached to a carrier sheet 81 so as to provide an RFID tag 110 or an RFID inlay 110. The terminal portions 12a, 12b of the antenna elements 10a, 10b may be located between the chip 50 and the carrier sheet 81.

Figure 6C:
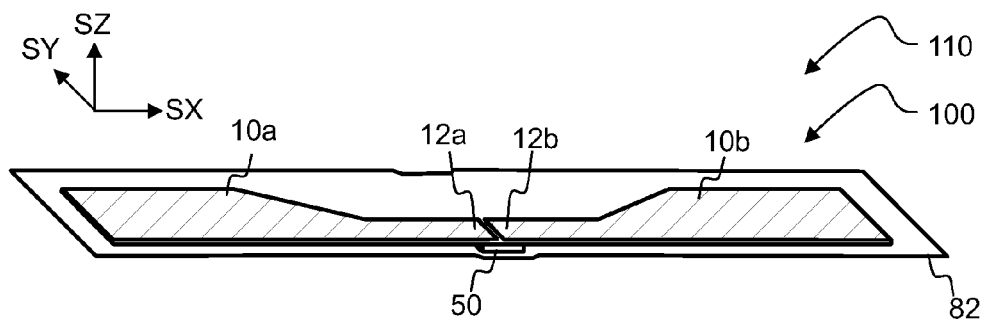
FIG. 6c shows, in a three dimensional view, an RFID transponder attached to a carrier sheet.

FIG. 6c shows a transponder 100 attached to a carrier sheet 82 so as to provide an RFID tag 110 or an RFID inlay 110. The chip 50 may be located between the terminal portions 12a, 12b and the carrier sheet 82.

Figure 6D:
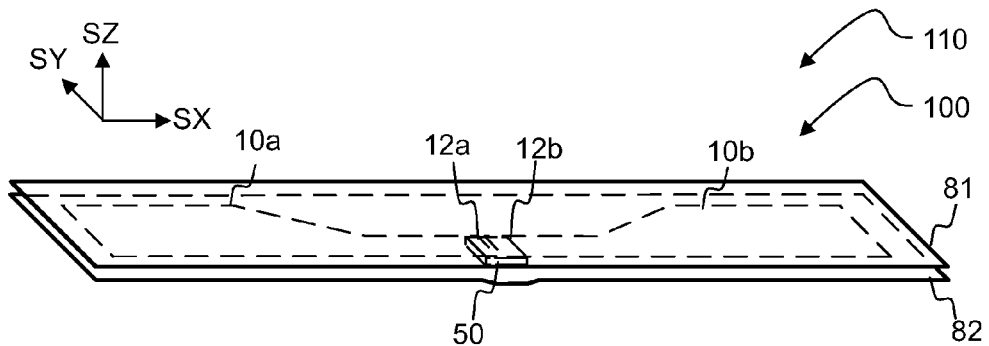
FIG. 6d shows, in a three dimensional view, an RFID transponder laminated between two carrier sheets.

FIG. 6d shows a transponder 100 laminated between two sheets 81, 82 so as to provide an RFID tag 110 or an RFID inlay 110.

The carrier sheet 81 and/or 82 may comprise e.g. plastic, paper or cardboard. The carrier sheet 81, 82 may be electrically insulating. The thickness of the sheet 81, 82 may be e.g. in the range of 0.03 to 1 mm. The carrier sheet 81 or 82 may optionally be lined with an adhesive layer. The adhesive layer may be optionally covered with a release layer.

Figure 7A:
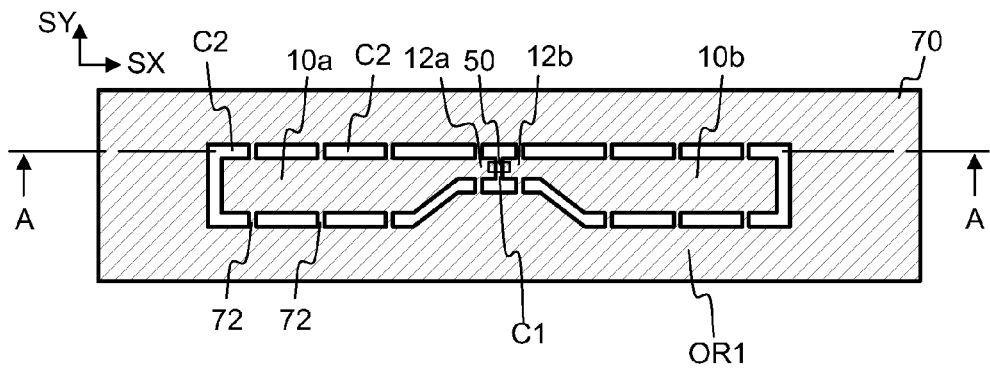
FIG. 7a shows, in a three dimensional view, antenna elements connected to an outer portion of the conductive sheet by a plurality of links.
Figure 7B:
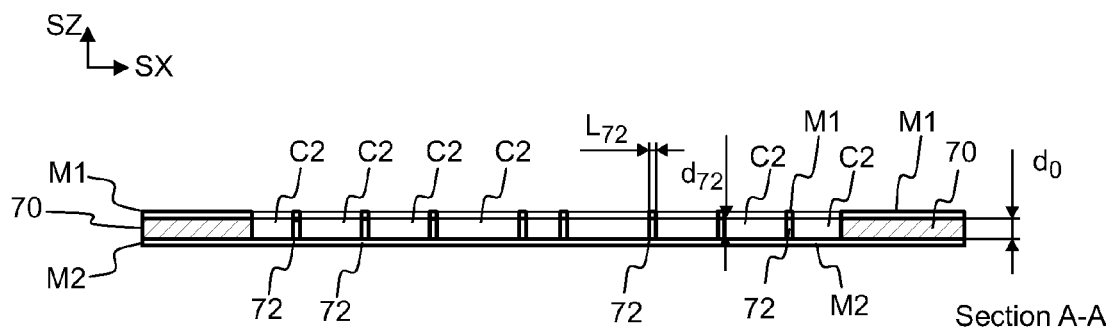
FIG. 7b shows, in a cross-sectional side view, the links of FIG. 7a, FIG. 7c shows, in a three dimensional view, cutting the links of FIG. 7a, FIG. 8 shows, in a side view, an apparatus for producing RFID tags by etching.
Figure 7C:
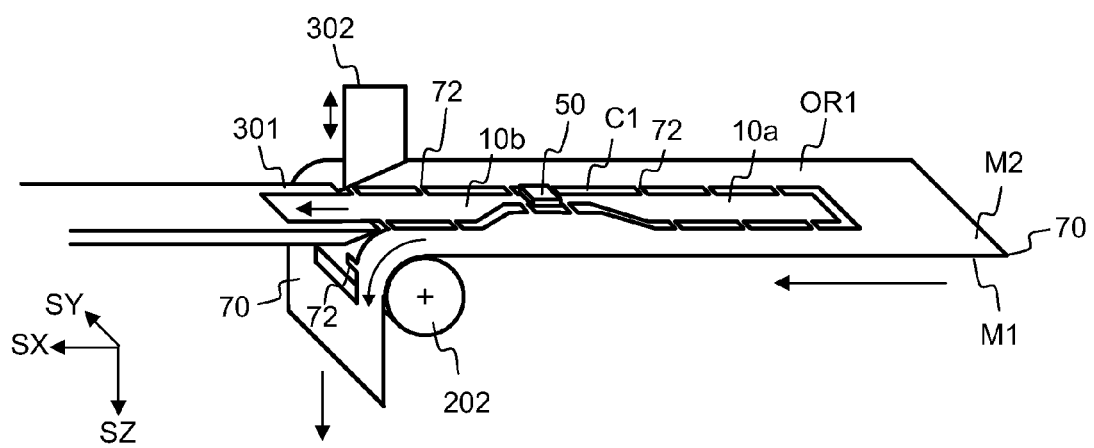
Figure 8:
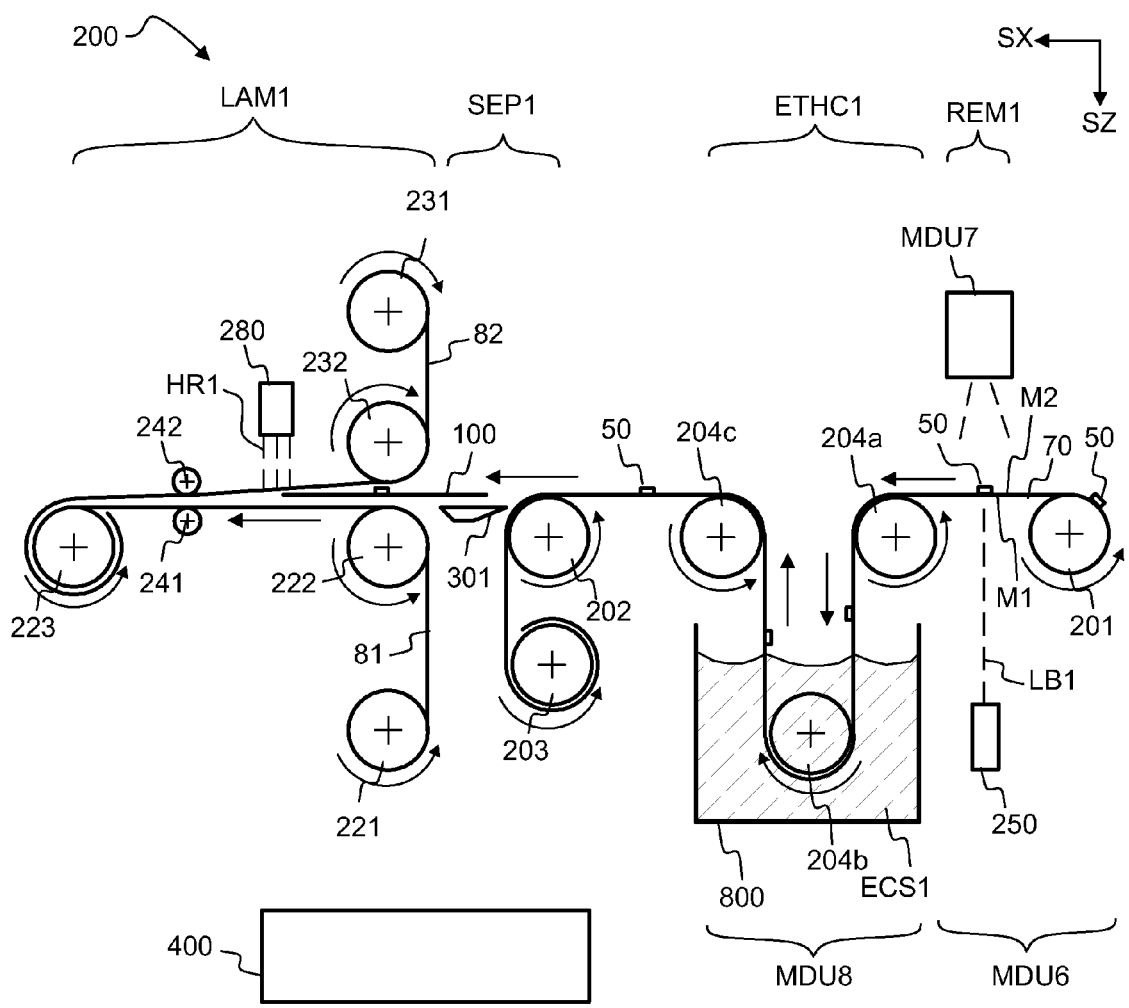

FIGS. 7a-8 show forming a plurality of grooves C2 such that the antenna elements 10a, 10b are connected to an outer portion OR1 by one or more links 72. The links 72 may consist of the conductive material of the sheet 70. The links 72 may help to hold the antenna elements 10a, 10b and the terminal portions 12a, 12b in place before the transponder 100 is separated from the outer portion OR1.

The slots C2 may be formed by etching at locations defined by the exposed portions U2. A plurality of links 72 may remain between the slots C2. The links 72 comprise material of the conductive sheet 70. The links 72 may temporarily support the antenna elements 10a, 10b and the chip 50. At a later stage, the antenna elements 10a, 10b may be completely separated from the outer portion OR1 of the conductive sheet 70 by breaking the links 72. The links may also be called as braces.

FIG. 7a shows, in a top view, the etched slots C2.

FIG. 7b shows, in a cross-sectional side view, the slots C2. The cross-section relates to the line A-A shown in FIG. 7a.

The width $L_{72}$ of the links 72 may be selected such that the antenna elements 10a, 10b may be easily separated from the outer portion OR1 of the conductive sheet 70. The thickness $d_{72}$ of the links may be e.g. substantially equal to the thickness $d_0$ of the conductive sheet 70.

FIG. 7c shows a method for separating the antenna elements 10a, 10b from the outer portion OR1 of the conductive sheet 70. After etching, the elements 10a, 10b may be attached to the outer portion OR1 by the links 72. The links 72 may be broken in order to separate the elements from the outer portion. The elements 10a, 10b may be pulled or pushed away from the outer portion in order to break the links 72.

At this stage, the reverse side of the conductive sheet 70 may still be covered with the second mask layer M2. When the transponder 100 is separated from the outer portion OR1, also the second mask layer M2 may be broken together with the links 72.

A portion of the sheet 70 may be bent by tensioning the sheet 70 around a bending member 202. The bending member may be e.g. by a roll 202. Consequently, an end portion of the element 10b may protrude with respect to the bent portion of the sheet 70. A separating member 301 may be arranged to push the protruding antenna element 10b away from the outer portion of the sheet 70 when the bent sheet 70 is moved with respect to the bending member 202. The separating member 301 may be a wedge.

The position of the links 72 may be selected such that the end of the antenna element 10b may protrude with respect to the outer portion of the sheet 70 when the sheet 70 is bent.

The dimensions of the links 72 or bridge elements 72 may be selected such that the antenna elements may be separated from the outer portion OR1 by pulling or pushing the antenna elements, i.e. the use of a cutting blade 302 is not necessary.

However, if desired, the apparatus may further comprise one or more cutting edges 302 for cutting the links 72. The cutting edges may be movable or stationary. The roller 202 may comprise one or more cutting edges.

Instead of the links 72, or in addition to the links 72, the antenna elements 10a, 10b may be temporarily connected to the outer portion OR1 by a plurality of bridge elements (not shown). The bridge elements may be formed e.g. by applying strips of glue to the sheet 70.

FIG. 8 shows an apparatus 200 for producing laminated RFID tags. A web of semi-manufactured transponders 100S may be moved by rolls 201, 204a, 204b, 204c, 202, 203. The web may comprise several chips 50 attached to a conductive sheet 70. Both sides of the conductive sheet 70 may be covered with mask layers M1, M2.

The chips 50 may be bonded to the conductive sheet 70 by a chip attaching unit. The chip attaching unit may comprise e.g. a holder 260 (FIG. 5a). The apparatus 200 may comprise the chip attaching unit (see FIG. 16).

The mask layers M1 and/or M2 may be applied e.g. by laminating, spraying and/or dip-coating. The apparatus 200 may comprise a laminating unit and/or a spraying unit for applying the mask layers M1 and/or M2 (see FIG. 16).

The apparatus 200 comprises a laser processing unit MDU6 for forming the exposed portions U1, U2. One or more exposed portions U1, U2 may be formed by processing the mask layer M1 and/or M2 with one or more laser beams LB1.

The apparatus 200 may comprise a monitoring unit MDU7 to detect the position of the chip 50.

The antenna elements 10a, 10b may be formed by etching in an etching unit MDU8. The etching unit MDU8 may comprise e.g. a tank or chamber 800 containing the etching substance ECS1.

After etching, residual etching liquid may be removed from the web by a washing unit. Residual washing liquid and/or residual etching substance may be optionally dried in a drying unit. The apparatus 200 may comprise the washing unit and/or a drying unit (See FIG. 16).

The transponders 100 may be separated from the outer portion of the sheet 70 by bending the sheet around the roll 202 and by pushing the antenna elements by the separating member 301.

A first sheet 81 may be moved by rolls 221, 222, 223. A second sheet 82 may be moved by rolls 231, 232, 223. The sheets 81, 82 may be moved substantially at the same speed as the conductive sheet 70.

The rolls 222, 232 may form a nip, which grabs the end of the antenna element, and which pulls the RFID transponder 100 such that it can be laminated between the sheets 81, 82. The lamination may be assisted by using pressure rolls 241, 242. If needed, heat HR1 for the lamination may be provided by a heating unit 280.

The laminated RFID transponders 100 may be collected around the roll 223. The laminated RFID transponders 100 may be delivered as sheets wound in reel. The sheet may comprise a one-dimensional or a two-dimensional array of RFID transponders 100. Individual RFID transponders 100 or RFID tags 110 may be separated from the sheet at a later stage e.g. by die-cutting or along perforations.

REM1 denotes a zone where the exposed portions U1, U2 are formed. ETCH1 denotes a zone where the grooves C1, C2 are etched. SEP1 denotes a zone where the RFID transponders 100 are separated from the outer portion of the conductive sheet 70. LAM1 denotes a zone where the RFID transponders 100 are laminated between protective sheets 81, 82.

The operation of the apparatus 200 may be controlled by a control unit 400. The control unit 400 may be configured to control e.g. the velocities of the sheets 70, 81, 82, movements of the laser beams, and laser power.

Figure 16:
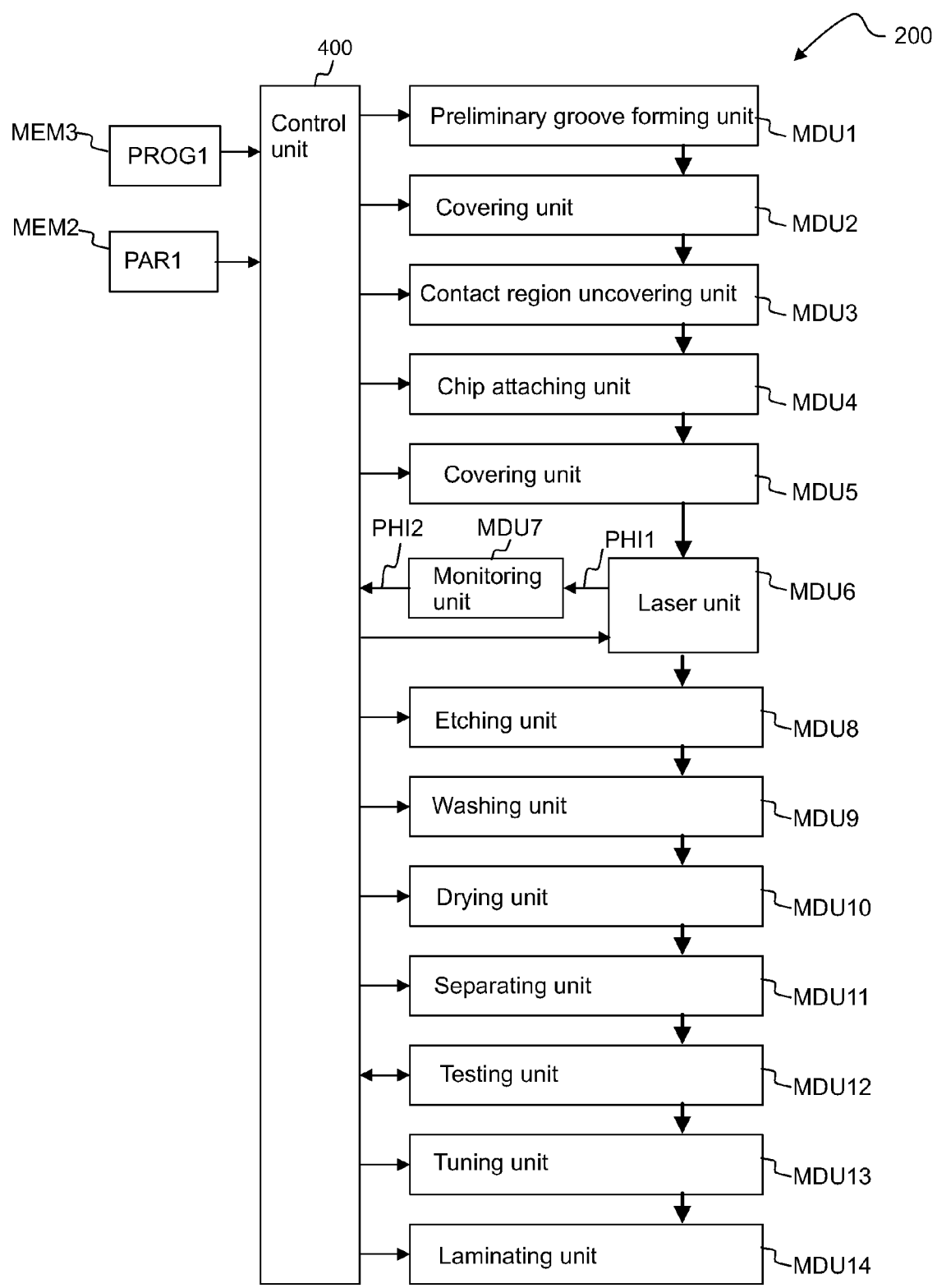
FIG. 16 shows units of an apparatus arranged to produce RFID transponders.

Functional units of a transponder manufacturing apparatus 200 are also shown in FIG. 16.

Figure 9A:
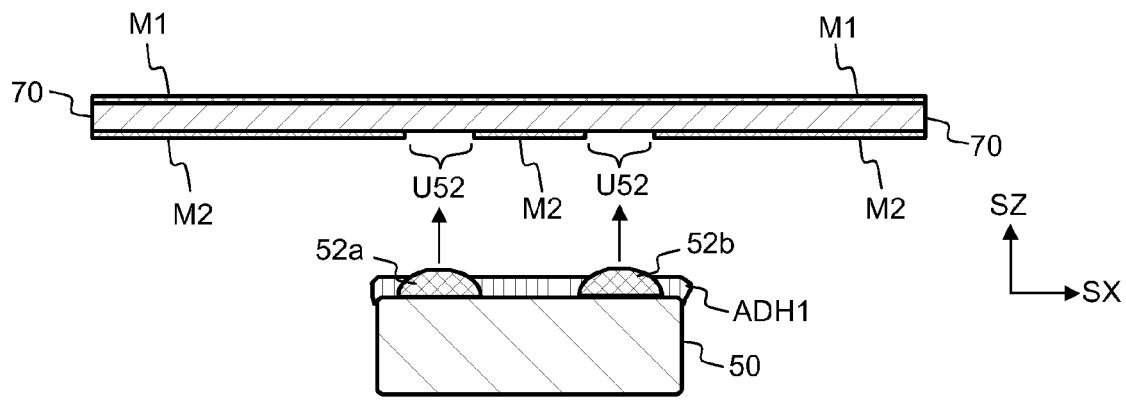
FIG. 9a shows, in a cross-sectional side view, attaching an RFID chip to a conductive sheet.

Referring to FIG. 9a, a mask layer M2 may be locally removed from one or more regions so as to form exposed portions U52. A contact element 52a, 52b of the chip 50 may be subsequently bonded to the exposed portion U52. The exposed portion U52 is advantageously fully exposed, which means that the metallic surface of the conductive sheet 70 is locally visible at the exposed portion U52.

The exposed portions U52 may be formed by removing the mask layer M2 e.g. by a laser beam, or by a mechanical device. The mechanical device may be e.g. a blasting nozzle, a scraper blade, or a rotating blade (milling cutter). The blasting nozzle may be arranged to provide a fluid jet, which locally removes the mask layer. For example, the blasting nozzle may be arranged to provide a stream of abrasive particles, which remove the mask layer. The particles may be e.g. ceramic or metal particles carried by a high-velocity gas jet or by a high-velocity liquid jet.

Adhesion of the chip 50 to the conductive sheet 70 may be improved by using an adhesive ADH1. In particular, the electrical connection between a contact element 52a and the conductive sheet 70 may be formed by using anisotropically conducting adhesive ADH1.

When the chip 50 has been attached to the sheet 70, an adhesive layer ADH1 surrounding the contact elements 52a, 52b may also operate as a mask layer, which protects the conductive (metallic) parts against the eroding effect of the etching substance ECS1.

The chip 50 may comprise an encapsulation, which is resistant to the eroding effect of the etching substance ECS1.

Figure 9B:
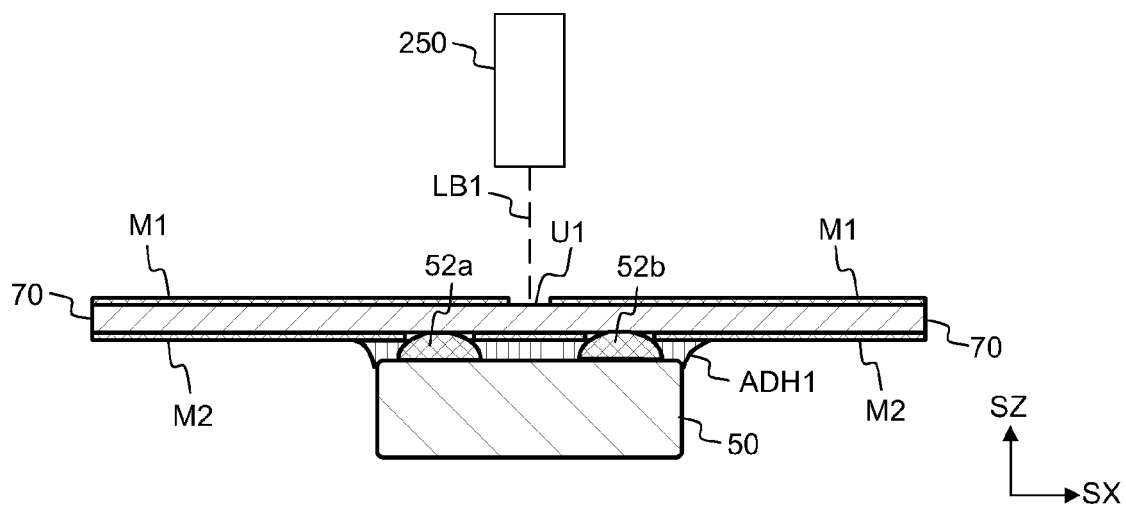
FIG. 9b shows, in a cross-sectional side view, locally removing a mask layer by a laser beam.

Referring to FIG. 9b, one or more exposed portions U1 (and/or U2) may be formed by processing the mask layer M1. The mask layer M1 may be processed with the laser beam LB1. In particular, the mask layer M1 may be removed by the laser beam LB1.

When the laser beam LB1 and the chip 50 are on different sides of the conductive sheet 70, the exposed portion U1 formed by the beam LB1 may overlap the chip 50.

Also one or more non-overlapping portions U2 may be formed by processing the mask layer M1 with a laser beam LB1, which is on a different side of the sheet 70 than the chip 50. The portions U2 do not overlap the chip 50.

The exposed portions U1, U2 may be formed after the position of the chip 50 with respect to the sheet 70 has been measured e.g. by using the monitoring unit MDU7.

Figure 9C:
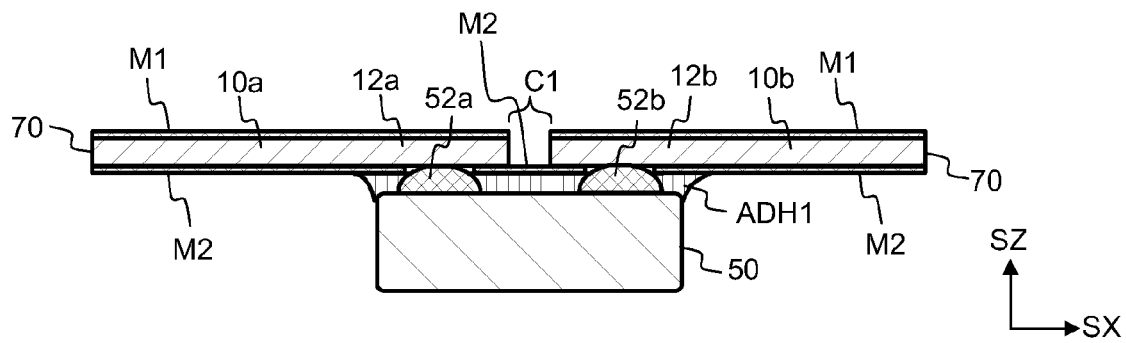
FIG. 9c shows, in a cross-sectional side view, a groove etched in the conductive sheet.

Referring to FIG. 9c, the groove C1 may be formed by removing material from the exposed portion U1 by etching. One or more non-overlapping grooves C2 may be formed by removing material from the exposed portions U2 by etching.

FIGS. 10a to 11d show forming the antenna elements such that a preliminary groove has been formed already before the chip is attached to the sheet 70.

Figure 10A:
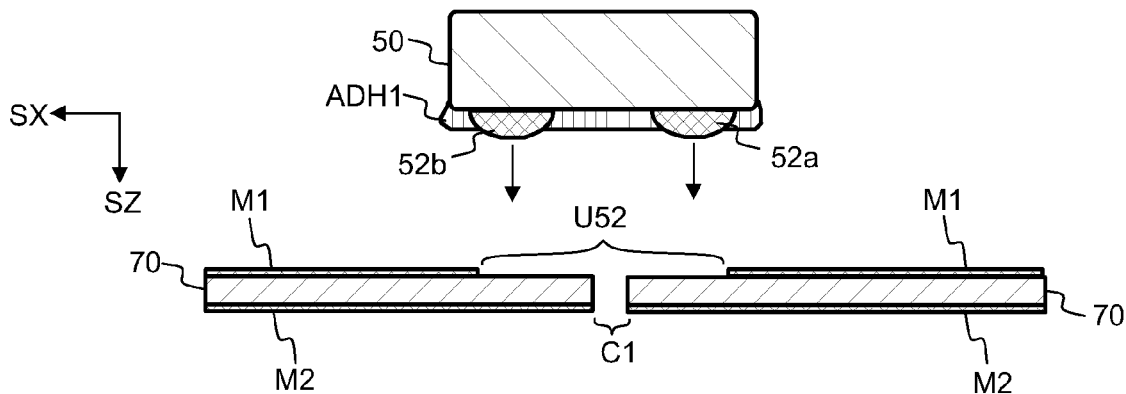
FIG. 10a shows, in a cross-sectional side view, attaching an RFID chip to an exposed portion of a conductive sheet.

Referring to FIG. 10a, the chip 50 may be attached to the conductive sheet 70 such that the chip 50 overlaps a groove C1. Preferably, both ends of the groove C1 should be visible after the chip 50 has been attached (See also FIGS. 11a, and 11b).

In this case, the positioning accuracy of the chip should be higher than when there is no preliminary groove. However, compensation of an erroneous position of the chip is still possible to a certain degree.

Figure 10B:
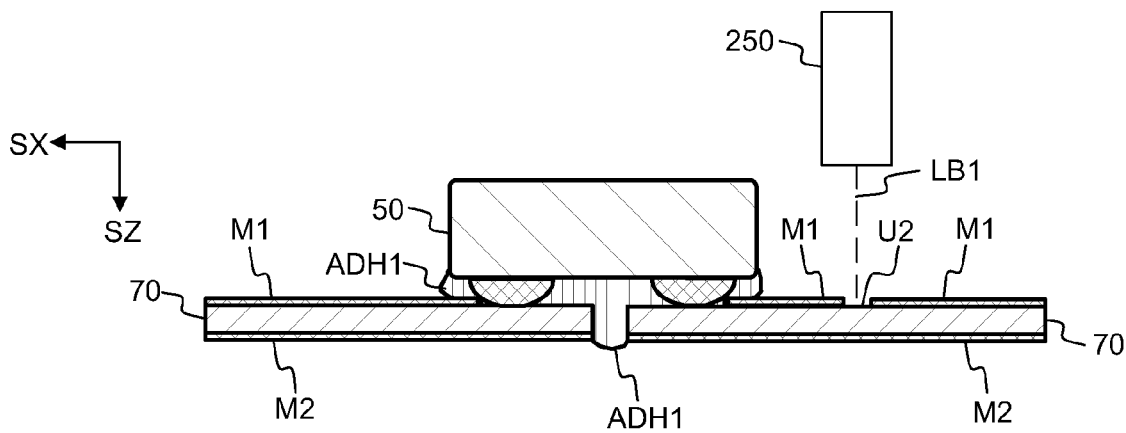
FIG. 10b shows, in a cross-sectional side view, locally removing a mask layer by a laser beam.

Referring to FIG. 10b, exposed portions U2 may now be formed by using a laser beam LB1, which is on the same side of the conductive sheet 70 as the chip 50. Thus, the same camera CAM1 (FIG. 5e) may also be used e.g. to monitor the position of the laser beam LB1. The camera CAM1 may also be used to monitor whether the mask layer M1 has been processed to a sufficient degree. In this case, the laser beam LB1 cannot easily impinge on a portion beneath the chip 50. The exposed portion U2 formed by the beam does LB1 not overlap the chip 50.

The adhesive ADH1 may seal the preliminary groove C1 before etching.

Figure 10C:
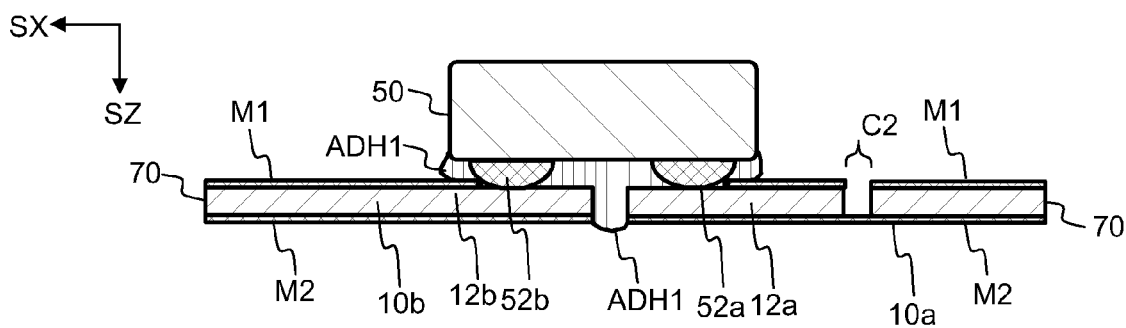
FIG. 10c shows, in a cross-sectional side view, a groove etched in the conductive sheet, FIG. 11a attaching an RFID chip to a conductive sheet having a first mask layer, wherein the first mask layer has been locally removed in order to bond the chip to the conductive sheet.

Referring to FIG. 10c, one or more grooves C2 may be formed by etching at the locations defined by the exposed portions U2, in order to form antenna elements 10a, 10b.

Figure 11A:
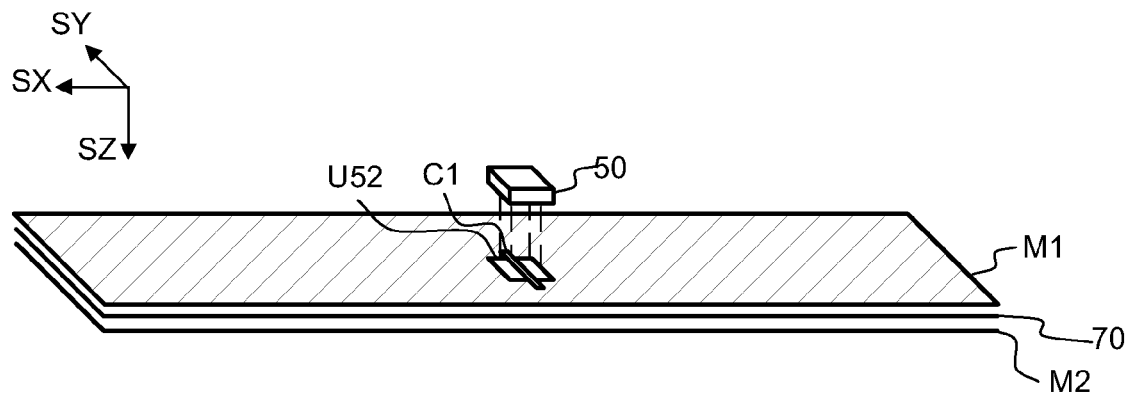
FIG. 11b shows, in a cross-sectional side view, locally removing a mask layer by a laser beam.
FIG. 11c shows, in a three dimensional view, etching one or more grooves in the conductive sheet.
FIG. 11d shows, in a three dimensional view, a transponder comprising antenna elements formed by etching.

FIG. 11a show attaching the ship 50 to the exposed portion U52 such that the chip 50 overlaps the preliminary groove C1.

Figure 11B:
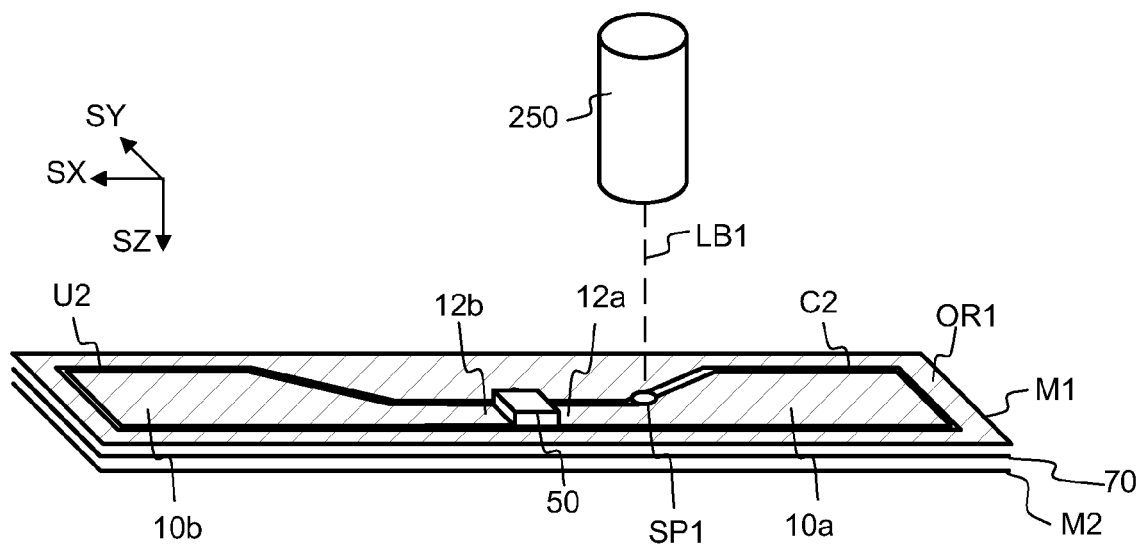

FIG. 11b shows processing one or more exposed portions U2 so as to define the position of the antenna element(s) 10a, 10b.

Figure 11C:
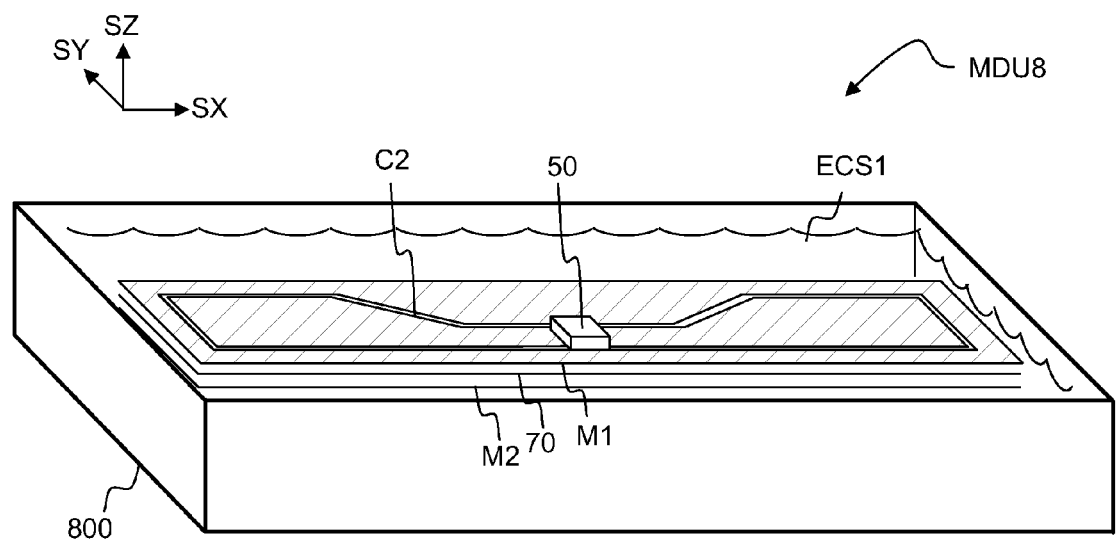

FIG. 11c shows etching the one or more grooves C2.

Figure 11D:
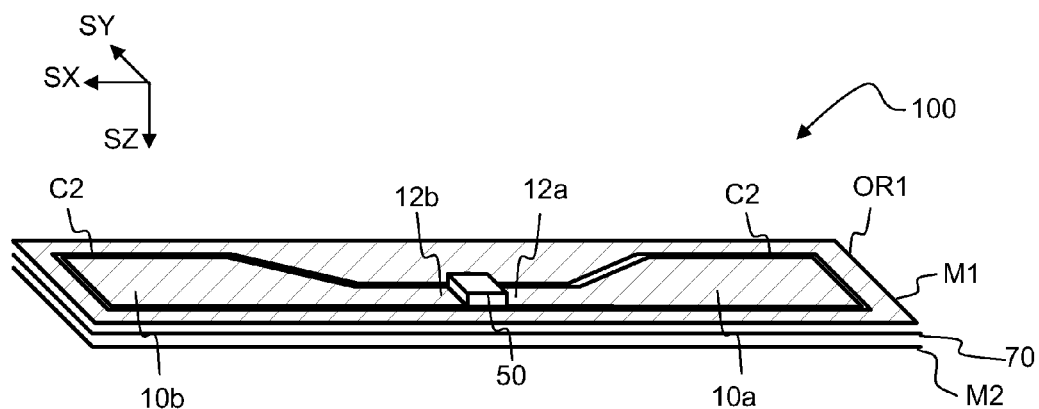

FIG. 11d shows a transponder 100 attached to an outer portion OR1. The transponder 100 may be separated from the outer portion OR1 by one of the methods described above (see e.g. the discussion related to FIGS. 5a and 7c).

When the chip 50 overlaps the preliminary groove C1, there is no need to process the mask layer M2 on the reverse side of the conductive sheet 70 with the laser beam LB1. In other words, the processing laser beam LB1 and the chip 50 may be on the same side of the sheet 70.

However, attaching the chip 50 over the preliminary groove C1 may require more accurate positioning than attaching the chip 50 to a sheet 70 which does not have a preliminary groove C1.

FIGS. 2 to 11d and FIG. 15a show manufacturing steps for producing a transponder 100, which has a dipole antenna. Said manufacturing steps may also be suitable for producing a transponder 100 comprising a coil antenna CA1 (see FIGS. 12a-12d and 15b). Said manufacturing steps may also be suitable for producing a transponder 100 comprising three or more antenna elements. Said manufacturing steps may also be suitable for producing a transponder 100 comprising one or more further electrical parts in addition to the chip and the antenna. For example the transponder may comprise a tamper detection loop, to a battery, and/or to a sensor. The chip 50 may be electrically connected to a tamper detection loop, to a battery, and/or to a sensor. The sensor may be e.g. a temperature sensor, a humidity sensor, a chemical sensor, or a strain sensor. In all these cases, a conductive portion of the transponder 100 may be formed by processing a portion U2 of a mask layer M1 or M2 by a laser beam LB1, and by etching a groove C2 at the corresponding location. In particular, the location of an exposed portion U2 may be selected based on detected position of the chip 50.

Figure 12A:
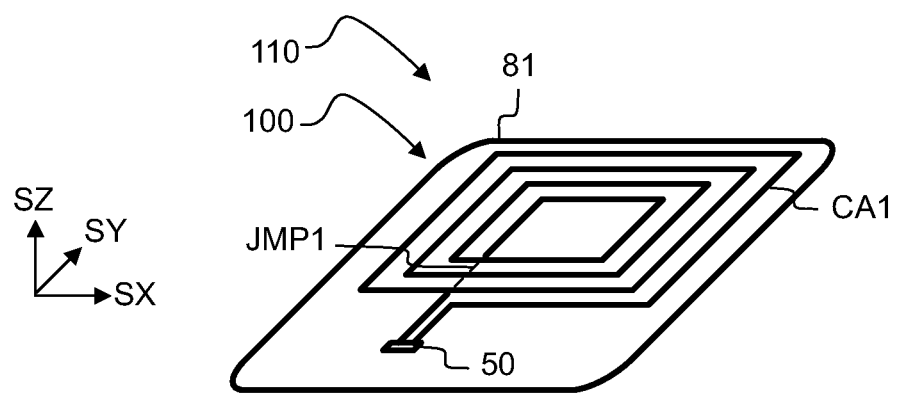
FIG. 12a shows, in a three dimensional view, an RFID transponder having a coil antenna.

FIG. 12a shows a transponder 100 comprising a coil antenna CA1 connected to the chip 50. While a first end of the coil antenna CA1 may be directly connected to the chip 50, the second end of the coil antenna CA1 (e.g. the inner part) may be connected to the chip 50 by a jump wire JMP1. The transponder 100 may be attached to a carrier sheet 81 in order to make an RFID tag.

Figure 12B:
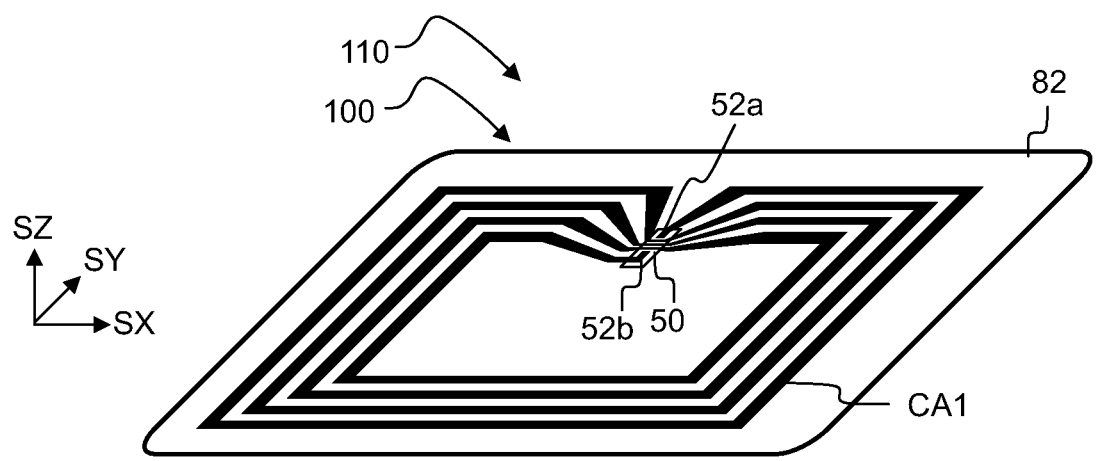
FIG. 12b shows, in a three dimensional view, an RFID transponder having a coil antenna implemented without a jump wire.

FIG. 12b shows a transponder 100 where one or more turns of the coil antenna are arranged to pass between the connecting elements of the chip 50. In other words, one or more turns of the coil antenna are arranged to pass between the terminal portions 12a, 12b of the coil antenna CA. Thus the external jump wire JMP1 shown in FIG. 12a is not needed.

Figure 12C:
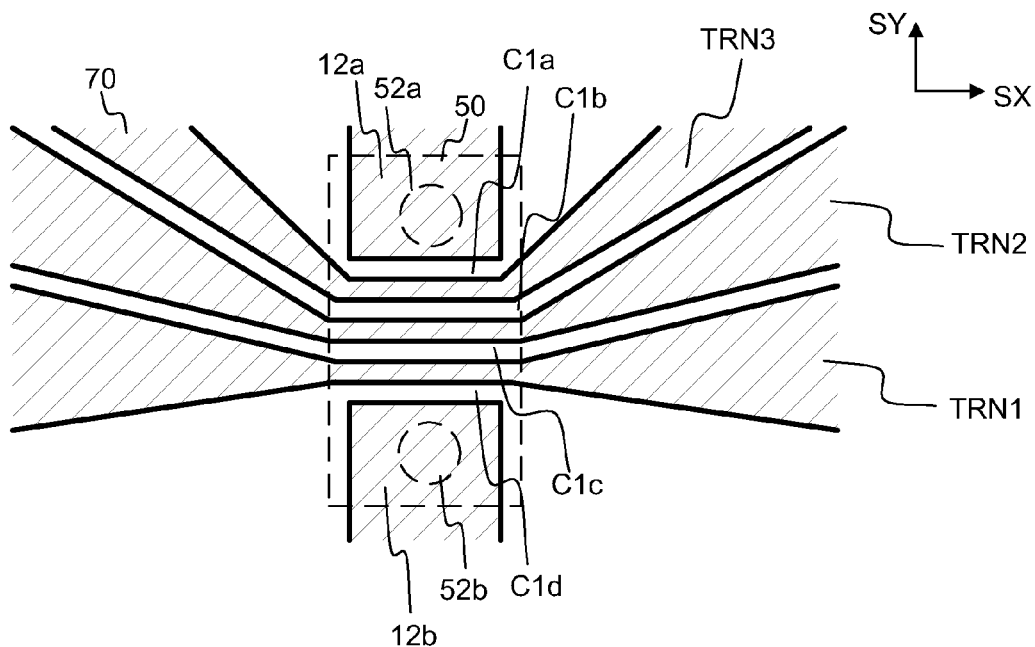
FIG. 12c shows, in top view, grooves etched in a conductive sheet, for producing a coil antenna.
Figure 12D:
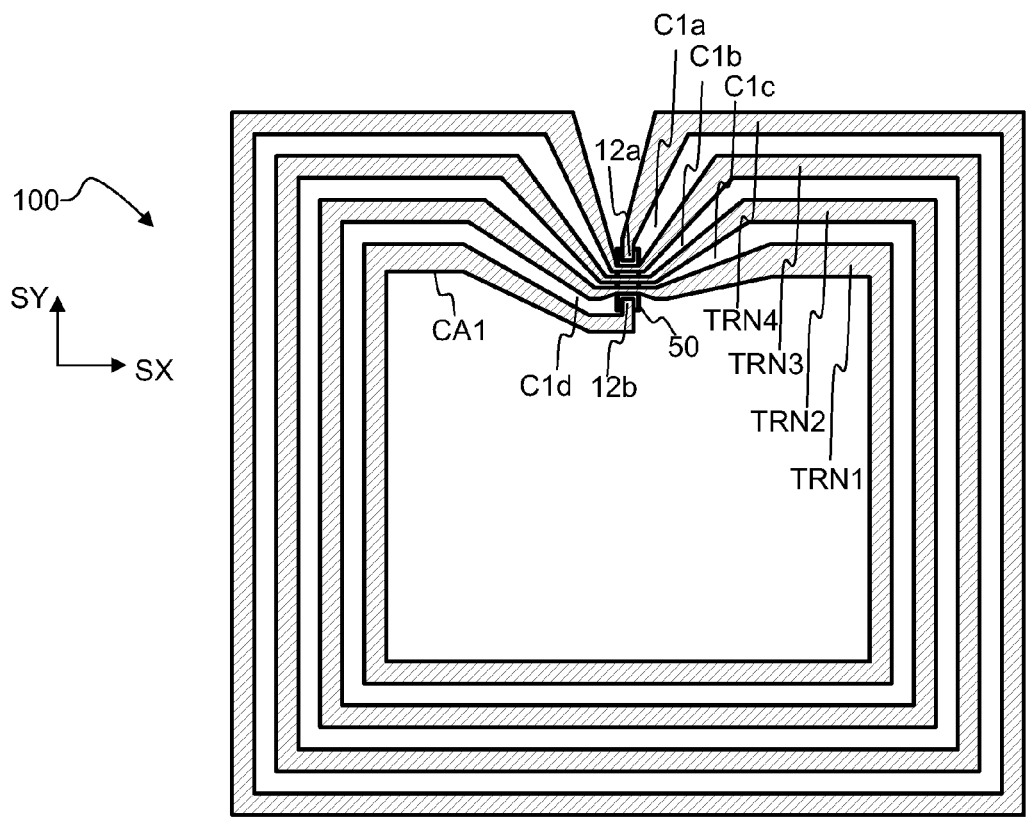
FIG. 12d shows, in a top view, an RFID transponder having a coil antenna implemented without a jump wire.
Figure 15A:
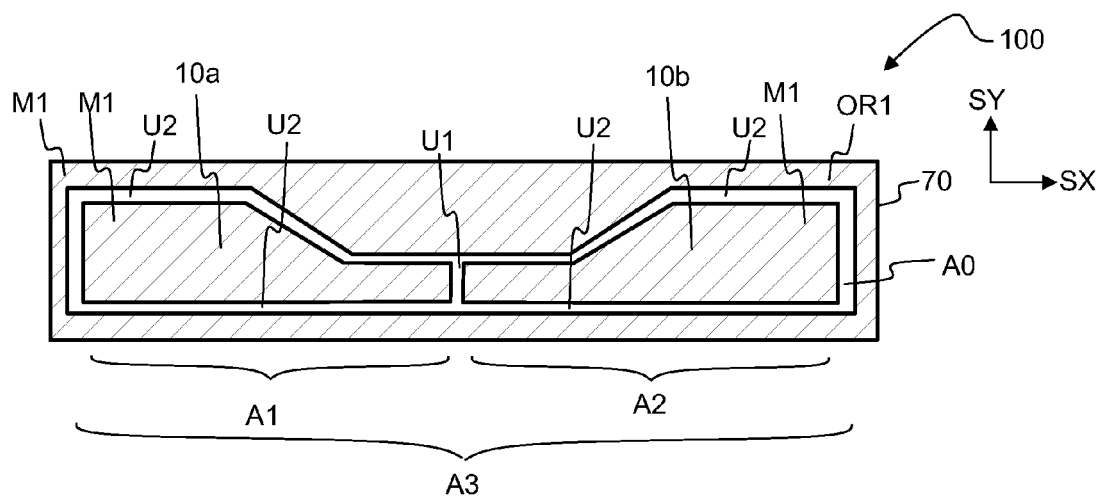
FIG. 15a shows the area of dipole antenna elements and the area of an exposed portion.
Figure 15B:
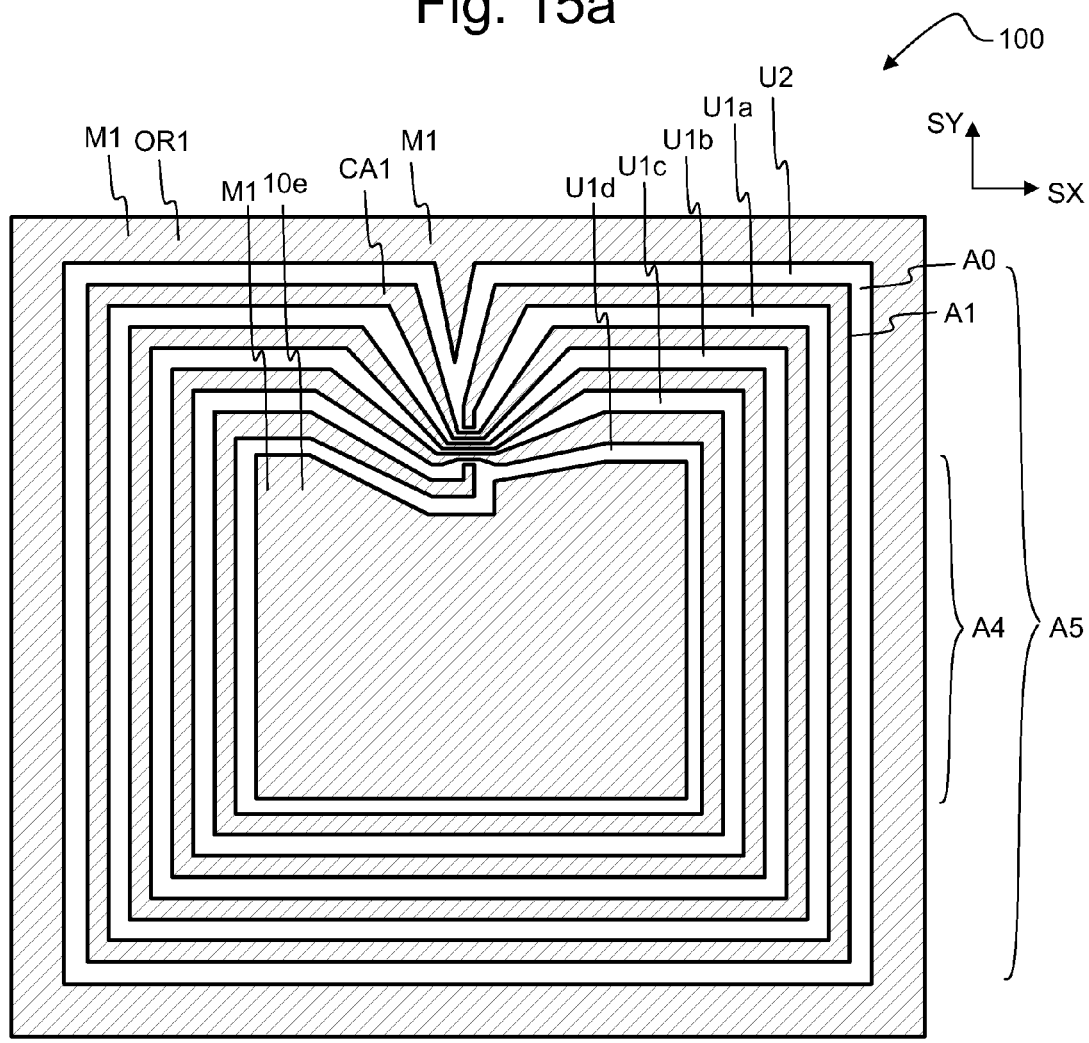
FIG. 15b shows the area of a coil antenna element and the area of an exposed portion.

FIG. 12c shows groove portions C1a, C1b, C1c, C1d, which may be used to define the form of the coil antenna CA1 shown in FIGS. 12b, 12d and 15b. The groove portions C1a, C1b, C1c, C1d may be produced by removing material from the exposed portions by etching.

Two or more groove portions C1a, C1b, C1c, C1d may be arranged to pass between a first connecting element 52a and a second connecting element 52b of the chip 50. The groove portions C1a, C1b, C1c, C1d may be portions of the same spiral groove.

Referring to FIG. 12d, a portion of conductive sheet 70 remaining between the groove portions C1a, C1b may operate e.g. as a portion of a third turn TRN3 of the coil antenna CA1. The portion remaining between the groove portions C1b and C1c may operate a as a portion of a second turn TRN2. The portion remaining between the groove portions C1c and C1d may operate a as a portion of a first turn TRN1.

In particular, a method for producing an RFID transponder may comprise:
  attaching a chip 50 to the conductive sheet 70,
  processing a region of a mask layer M1 located between a first connecting element 52a, and a second connecting element 52b of the chip 50 so as to form an exposed portion U1,
  forming a groove C1 at the location of the exposed portion U1 by etching so as to form a coil antenna CA1, which is galvanically connected to the first connecting element 52a and the second connecting element 52b.

In particular, the chip 50 may be attached to the conductive sheet 70 by an adhesive ADH1, which accurately fixes the positions of the thin conductive portions defined by the groove portions C1a, C1b, C1c, C1d.

FIG. 12d shows how the turns TRN1, TRN2, TRN3 of the coil antenna CA1 may pass through a space between the terminal portions 12a, 12b. The end of the turn TRN4 forms the terminal portion 12a. A transponder 100 comprising the coil antenna CA1 may be substrateless or it may be fixed to a carrier sheet 81 so as to provide an RFID tag/inlay.

FIG. 12c shows a detail of the antenna of FIG. 12d.

Figure 13:
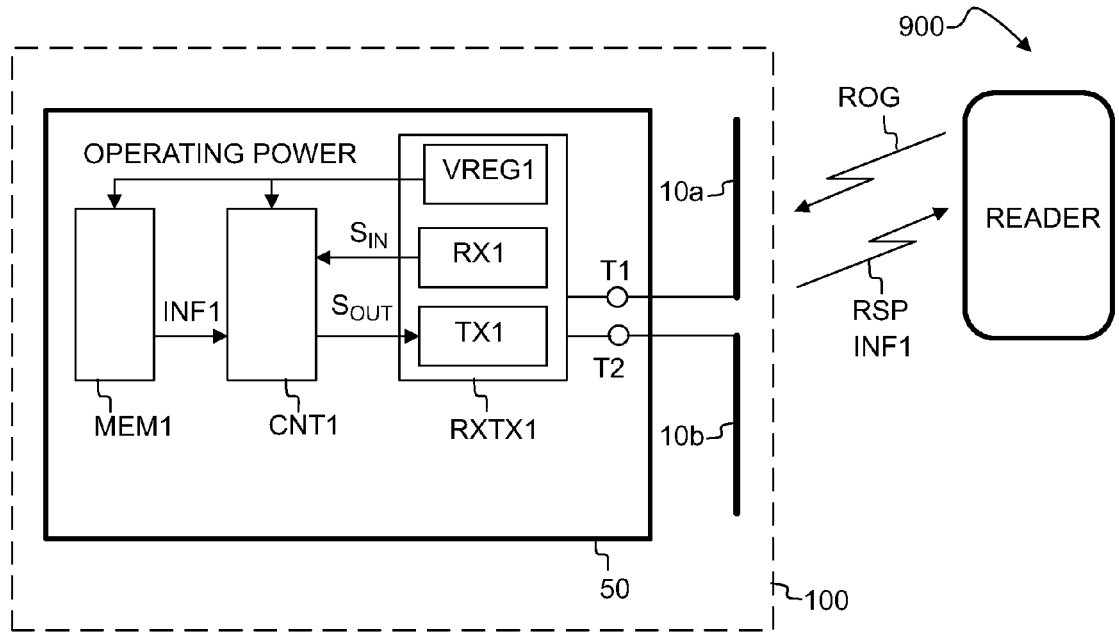
FIG. 13 shows functional units of an RFID transponder.

Referring to FIG. 13, a radio frequency identification transponder 100 may be arranged to send a response RSP to an interrogation signal ROG. The interrogation signal ROG may be sent from a portable or stationary reader 900.

The transponder 100 may comprise a communication block connected to one or more antenna elements 10a, 10b via terminals T1, T2. The terminals T1, T2 may be galvanically connected to the contact elements 52a, 52b of the chip 50.

The communication block may be implemented in an RFID chip 50. The communication block may comprise a radio frequency unit RXTX1, a control unit CNT1, and a memory MEM1. The radio frequency unit RXTX1 may comprise a signal receiver RX1, and a signal transmitter TX1.

The radio frequency unit RXTX1, the control unit CNT1, and the memory MEM1 may be implemented on the same semiconductor chip 50.

The receiver RX1 may provide an input signal $S_{IN}$ based on the received interrogation signal ROG. The control unit CNT1 may be arranged to enable transmission of the information INF1 e.g. when the input signal $S_{IN}$ contains a correct password code.

The response RSP transmitted by the transponder 100 may comprise information INF1. The information INF1 may comprise e.g. an electronic item code (EPC). The information INF1 may be retrieved from the memory MEM1 by the control unit CNT1. The control unit CNT1 may send an output signal $S_{OUT}$ to the radio frequency unit RXTX1. The output signal $S_{OUT}$ may comprise the information INF1. The transmitter TX1 may generate the radio-frequency response RSP based on the output signal $S_{OUT}$.

The radio frequency unit RXTX1 may comprise a voltage supply VREG1, which is arranged to extract operating power from an incoming radio frequency signal.

FIG. 14 shows a plurality of tagged items 700a, 700b, 700c. An RFID transponder 100a may be attached to the item 700a, An RFID transponder 100b may be attached to the item 700b, and An RFID transponder 100c may be attached to the item 700c.

Each transponder 100a, 100b, 100c, may be arranged to transmit a response RSP to an interrogation signal ROG. A response transmitted by the transponder 100a may comprise information INF1a associated with the item 700a. A response transmitted by the transponder 100b may comprise information INF1b associated with the item 700b. A response transmitted by the transponder 100c may comprise information INF1c associated with the item 700c.

The information INF1 may e.g. comprise identification data for each transponder 100 so that the number of the items 700a, 700b, 700c can be counted, and the type of the items can be identified.

The reader 900 may comprise a body 910 and a user interface 920. The user interface 920 may comprise e.g. a visual display for displaying information sent by the transponders 100, 100a, 100b, 100c. The user interface 920 may comprise a keyboard for receiving data and/or commands.

The radio frequency unit RXTX1 may comprise a signal receiver RX1, and a signal transmitter TX1. The receiver RX1 may also be called as a signal demodulator. The transmitter TX1 may also be called as a signal modulator. The radio frequency unit RXTX1 may also be called as an analog radio frequency interface.

The radio frequency unit RXTX1 may comprise connection terminals T1, T2, which may be connected to at least one antenna 10a, 10b. The at least one antenna may be a dipole antenna, which comprises a pair of antenna elements 10a, 10b. A first terminal T1 may be connected to a first element 10a, and a second terminal T2 may be connected to a second element 10b. Alternatively, the first terminal T1 may be connected to an antenna 10a, and the second terminal T2 may be connected to an electrical ground (not shown). Alternatively, the terminals T1, T2 may be connected to a coil antenna CA1 (FIG. 17b).

In particular, the information INF1 may comprise an electronic item code (EPC). A unique electronic item code assigned to an item may be stored in the transponder 100 as a binary number. In particular, a bit string may include information regarding an item such as its retail price, manufacturer, type of the item, serial number, for example.

The input signal $S_{IN}$ and the output signal $S_{OUT}$ may be digital signals.

The reader 900 and the transponder 100 may be arranged to communicate according to a far field communication protocol. The reader 900 and the transponder 100 may be arranged to communicate according to the same RFID communication standard. In particular, the reader 900 and the transponder 100 may be arranged to communicate according to one or more of the following standards:

ISO/IEC 18000-2A (frequency band 125/134.2 kHz, reading distance e.g. up to 2 m)

ISO/IEC 18000-2B (frequency band 125/134.2 kHz)

ISO 18000-3 (frequency band 13.56 MHz, reading distance e.g. up to 3 m)

ISO 18000-7 (frequency band 433 MHz)

ISO 18000-6A (frequency band 860-960 MHz, reading distance e.g. up to 3 m)

ISO 18000-6B (frequency band 860-960 MHz)

ISO 18000-6C (frequency band 860-960 MHz)

EPCglobal Class 0 (frequency band 860-960 MHz)

EPCglobal Class 1 (frequency band 860-960 MHz)

EPCglobal Class 1 Gen 2 (frequency band 860-960 MHz)

ISO 18000-4 (frequency band 2.45 GHz, reading range e.g. up to 12 meters)

(Reference is made to the latest versions of the standards as in force on 29 Dec. 2011).

The reader 900 and the transponder 100 may be arranged to communicate according to a near field communication protocol (NFC). In particular, the reader 900 and the tag 100 may be arranged to communicate according to one of the following standards:

Proximity cards: ISO/IEC 14443 (frequency band 13.56 MHz, reading distance e.g. up to 12.5 cm)

Vicinity cards: ISO/IEC 15693 (frequency band 13.56 MHz, reading distance e.g. up to 1.5 m)

(Reference is made to the latest versions of the standards as in force on 29 Dec. 2011).

The radio frequency unit RXTX1 may comprise a voltage supply VREG1, which is arranged to extract operating power from an incoming radio frequency signal. In particular, the voltage supply VREG1 may be arranged to extract operating power from the interrogation signal ROG. The operating power may be distributed to the control unit CNT1, to the memory MEM1 and/or to the radio frequency unit RXTX1 itself.

The transponder 100 may be a passive device which does not comprise a battery. The transponder 100 may be powered e.g. by electromagnetic energy transmitted from the reader 900. In particular, the combination of an antenna structure 10a, 10b, CA1 and a radio frequency unit RXTX1 of a transponder 100 may be arranged to provide operating power for the transponder 100 by extracting energy of an in-coming electromagnetic signal ROG.

A dipole antenna 10a, 10b may transmit information INF1 from the transponder 100 to the reader 900 by back scattering. Alternatively, an inductive antenna may be used. A coil antenna CA1 of the transponder 100 may cause modulation of the load for the reader 900. This modulation can be used for transmitting data from the transponder 100 to the reader 900.

The transponder 100 may be an active device, which comprises a battery for providing operating power for the radio frequency unit RXTX1.

The transponder 100 may be battery-assisted, i.e. power provided by a battery may be used for processing information and/or storing information in the memory MEM1, and the response RSP may be transmitted by using reflected power of the interrogation signal ROG (by using passive reflected power).

The transponder 100 may comprise a capacitor or rechargeable battery for storing operating energy extracted from an interrogation signal ROG.

Electromagnetic interrogation signal ROG transmitted in a wireless manner is converted into an electrical signal by the antenna elements 10a, 10b. The electrical signal is connected to the receiver RX1 of the radio frequency unit RXTX1 via the connection terminals T1 and T2. Also the electrical signal is a radio frequency signal, which oscillates at the same frequency as the electromagnetic signal.

The chip 50 may comprise a transponder 100 implemented by integrated circuits. The antenna elements 10a, 10b, CA1 and the chip 50 may be supported on a carrier sheet 81, 82. The carrier sheet 81, 82 may be e.g. paper, cardboard, or plastic film.

The total thickness of a tag 110 or a transponder 100 (in the direction SZ) may be smaller than or equal to 1 mm. The tag 110 or a transponder 100 may be flexible. A tag 110 may further comprise an adhesive layer (not shown). A tag 110 may further comprise a release layer, which protects the adhesive layer. The release layer can be removed before the tag 110 is attached to an item (e.g. 700a) by the adhesive layer.

The tag 110 or a transponder 100 may be attached or associated with an item 700a (See FIG. 14). The item 700a may be a product, e.g. a television, mobile phone, component of an automobile. The item 700a may be a package containing an item, a package containing foodstuff, a package containing medicine, a package containing a chemical substance.

In an embodiment, an item 700a may be substantially thicker than an RFID transponder 100 or an RFID tag 110. The thickness of the item 700a may be e.g. greater than or equal to 10 mm. In an embodiment, an RFID transponder 100 may be embedded in the item 700a or otherwise attached to the item 700a such there is no need to use a substrate film between the antenna element(s) and the item 700a. Thus, the use of materials may be minimized in an environmentally friendly way.

A plurality of tagged items 700a, 700b, 700c may stored in a storage, and a user may rapidly make an inventory of the items 700a, 700b, 700c stored in said storage by receiving the information INF1.

Advantageously, the chip 50 comprises encapsulation (i.e. housing). Two or more portions of the outer surface of chip 50 may be electrically conductive such that they can be used as the contact elements 52a, 52b. The contact elements 52a, 52 are exposed before they are electrically connected to the antenna portions 10a, 10b.

The contact elements 52a, 52b may protrude from the (dielectric) encapsulation.

Contact elements 52a, 52b of an RFID chip may be bonded to the antenna elements 10a, 10b e.g. by laser welding or by laser soldering.

Laser welding may comprise heating the surface of a contact element 52b by a laser beam LB0 to a temperature, which is higher than the melting point of the conductive sheet 70.

A contact element 52b may comprise a core coated with a solder material. The melting temperature of the solder material may be lower than the melting point of the core in order to maintain the dimensions of the contact element 52b during bonding. Laser soldering may comprise heating the surface of a contact element 52b by a laser beam LB0 to a temperature, which is higher than the melting temperature of a solder material, and lower than the melting temperature of the conductive sheet 70.

In an embodiment, the electrical contact between the contact elements 52a, 52b and the antenna elements 10a, 10b may be formed by an electrically conducting adhesive, i.e. without using laser welding or soldering. In particular, the adhesive may be an anisotropically conductive adhesive (anisotropically conductive paste, ACP).

The chip 50 may be more securely fastened to the antenna elements 10a, 10b by using an adhesive ADH1 between the chip 50 and the antenna elements 10a, 10b.

The encapsulation may be arranged to mechanically protect the electronic components of the chip 50 and/or to prevent corrosion of the electronic components. In particular, the encapsulation may protect the electronic components from moisture. The moisture may induce corrosion and may have an adverse effect on the electrical properties of the electronic components. The encapsulation may comprise e.g. polymer material and/or ceramic material. The polymer material may comprise e.g. thermoplastic polymer, thermosetting polymer or elastomer. The electronic components of the chip 50 may be e.g. transistors, diodes, capacitors and resistors implemented on a layer of semiconductor material.

The chip 50 is advantageously protected by an encapsulation, by one or more the mask layers and/or by the adhesive ADH1 such that the chip 50 can be immersed in the etching substance ECS1 during the etching without damaging the chip 50.

The hatching shown in FIGS. 4a-4c, 7b, 9a-10c indicates a cross-section. The hatching shown in FIGS. 1-3, 5a-6c, 7a, 11a-11d, 12c, 12d indicates a mask layer. The hatching shown in FIGS. 1-3, 5a-6c, 7a, 11a-11d, 12c, 12d does not indicate a cross-section.

Referring to FIG. 15a, A1 denotes the area of a first antenna element 10a. A2 denotes the area of a second antenna element 10b. A0 denotes the total area of the exposed portions U1, U2, which define the form of the antenna elements 10a, 10b.

The area A0 of the exposed portions U1, U2 may be e.g. smaller than or equal to 80% of the summed area (A1+A2) of the (one or more) antenna elements 10a, 10b of the transponder 100. The area A0 may be smaller than or equal to 50% of the summed area. Advantageously, the area A0 may be smaller than or equal to 20% of the summed area. Preferably, the area A0 may be smaller than or equal to 10% of the summed area.

When the area of the exposed portions is small when compared with the area of the antenna elements, this may increase the production rate, because a smaller area needs to be processed with the laser beam LB1. Also the consumption of the etching substance ECS1 may be reduced.

The combined area A3 denotes the sum of the areas A0, A2, and A2 (i.e. A3=A0+A1+A2). The outer portion OR1 may surround the combined area A3 such that the outer portion OR1 does not overlap the combined area A3. The areas A0, A1, A2, A3 are one-sided areas, which means that the surface area on the reverse side of the conductive sheet 70 is not taken into consideration.

Referring to FIG. 15b, a coil antenna CA1 may be formed by the laser processing and the subsequent etching such that the coil antenna CA1 is surrounded by an outer portion OR1. A residual portion 10e may be formed in the middle of the coil antenna CA1. The adjoining exposed portions U2, U1a, U1b, U1d, U1d define the form of the coil antenna CA1. A0 denotes the summed area of the exposed portions U2, U1a, U1b, U1d, U1d. A1 denotes the area of the coil antenna CA1. A4 denotes the area of the residual portion 10e. A5 denotes the combined area of the exposed portions, the coil antenna, and the residual portion, i.e. A5=A0+A1+A4.

The area A0 of the exposed portions may be e.g. smaller than or equal to 80% of the area A1 of the antenna element CA1 of the transponder 100. The area A0 of the exposed portions may be e.g. smaller than or equal to 50% of the area A1 of the antenna element CA1 of the transponder 100. Advantageously, the area A0 may be smaller than or equal to 20% of the area A1. Preferably, the area A0 may be smaller than or equal to 10% of the area A1.

When the area A4 of the residual portion 10e is taken into consideration, the area A0 of the exposed portions may be e.g. smaller than or equal to 80% of the sum of the areas A1 and A4. The area A0 of the exposed portions may be smaller than or equal to 50% of the sum of the areas A1 and A4. Advantageously, the area A0 of the exposed portions may be smaller than or equal to 20% of the sum of the areas A1 and A4. Preferably, the area A0 of the exposed portions may be smaller than or equal to 20% of the sum of the areas A1 and A4.

Referring to FIG. 16, an apparatus 200 for producing an RFID transponder 100 comprises at least a laser processing unit MDU6 and an etching unit MDU8.

The apparatus 200 may further comprise a control unit 400, a preliminary groove forming unit MDU1, a covering unit MDU2, a contact region uncovering unit MDU3, a chip attaching unit MDU4, a covering unit MDU5, a monitoring unit MDU7, a washing unit MDU9, a drying unit MDU10, a separating unit MDU11, a testing unit MDU12, a tuning unit MDU13, and/or a laminating unit MDU14.

The operation of the units MDU1 to MOD 14 may be controlled by the control unit 400.

The horizontal arrows of FIG. 16 indicate transfer of information. In particular, the horizontal arrows of FIG. 16 may indicate signals. The vertical arrows of FIG. 16 indicate transfer of material. In particular, the vertical arrows of FIG. 16 may indicate transfer of a semi-manufactured transponder 100S from one unit to another unit.

PHI1 denotes physical information obtained from the laser unit MDU6. PHI1 may denote physical information obtained from a semi-manufactured transponder 100S when it is located in the laser unit MDU6. The physical information PHI1 may be carried e.g. by light reflected from the chip 50 and/or by light reflected from the laser spot SP1.

PHI2 denotes a data signal determined based on the physical information PHI1. The data signal PHI2 may specify e.g. the position of the chip 50 and/or the position of the laser spot SP1. The data signal PHI2 may specify e.g. the position of the chip 50 with respect to the laser spot SP1 or with respect to a reference location. The data signal PHI2 may be a position signal.

A memory MEM3 may store computer program code PROG1 which when carried out by the control unit 400 is for producing the transponders 100 by laser processing and by the etching. A memory MEM2 may store one or more operating parameters PAR1 for controlling the laser processing and/or for controlling the etching. An operating parameter may define e.g. laser power, intensity of the laser beam LB1, width of a laser spot SP1, velocity of the laser spot SP1 with respect to the sheet 70, or etching time (duration of exposure to the etching substance ECS1).

The preliminary groove forming unit MDU1 may be arranged to form a preliminary groove C1 before attaching the chip 50. The preliminary groove forming unit MDU1 is optional, and may be omitted if the chip 50 and the processing laser beam LB1 are on different sides of the sheet 70.

The covering unit MDU2 may be arranged to cover the conductive sheet 70 with a mask layer M1 and/or M2. A mask layer M1 and/or M2 may be applied e.g. by spraying, laminating or dip-coating.

The contact region uncovering unit MDU3 may be arranged to locally remove the mask layer M1 and/or M2 to form one or more exposed regions U52. The exposed regions U52 may be bonded to the contact elements 52a, 52b of the chip 50. The contact region uncovering unit MDU3 is optional and may be omitted if the sheet 70 has not yet been covered with the mask layer when the chip 50 is attached.

The chip attaching unit MDU4 may be arranged to attach the chip 50 to the conductive sheet 70. The chip attaching unit MDU4 may be arranged to bond the contact elements 52a, 52b of the chip 50 to the conductive sheet 70. The chip attaching unit MDU4 may be arranged to apply adhesive ADH1 between the chip 50 and the conductive sheet 70.

The covering unit MDU5 may be arranged to cover the conductive sheet 70 with a mask layer M1 and/or M2. The covering unit MDU5 is optional and it may be omitted e.g. if both sides of the sheet were already covered by the unit MDU2.

The laser processing unit MDU6 may be arranged to form regions U1, U2 by laser processing. The laser unit MDU6 comprises one or more lasers 250 arranged to provide one or more laser beams LB1.

The monitoring unit MDU7 may be arranged to provide a signal PHI2 based on the physical information PHI1. The monitoring unit MDU7 may be arranged to provide a signal PHI2 based on the detected position of the chip 50. The control unit 400 may be arranged to control the position of a laser beam LB1 based on the signal PHI2. The monitoring unit MDU7 may comprise e.g. a proximity sensor to detect the position of the chip 50. In particular, the monitoring unit MDU7 may comprise e.g. a camera CAM1 to detect the position of the chip 50 and/or the position of the laser beam LB1. The signal PHI2 may be a position signal.

When forming the exposed portions U1, U2 for producing a first transponder, the control unit 400 may be arranged to control the position of the laser beam LB1 based on data measured from a second (different) transponder. Data measured from a second (different) transponder may be provided by the testing unit MDU12. The data may be e.g. radio-frequency performance data of the second transponder.

The etching unit MDU8 may be arranged to form one or more grooves C1, C2 by etching material of the conductive sheet 70 from the one or more processed regions U1, U2.

The etching unit MDU8 may comprise a vessel 800, which in turn may comprise etching substance ECS1. The etching unit MDU8 may optionally comprise e.g. a heating unit for heating the etching substance ECS1. The etching unit MDU8 may optionally comprise e.g. a stirring unit (e.g. a rotating paddle) for increasing etching speed. The etching unit MDU8 may optionally comprise a filtering unit for removing impurities from the etching substance ECS1. The etching unit MDU8 may optionally comprise a recovery unit for removing dissolved material from the etching substance ECS1. The etching unit MDU8 may optionally comprise an analysis unit for monitoring chemical composition of the etching substance ECS1.

The washing unit MDU9 may be arranged to remove residual etching substance ECS1 from the transponder 100 after the etching. In particular, the transponder may be rinsed with water and/or alcohol.

The drying unit MDU10 may be arranged to remove residual washing liquid from the transponder 100 e.g. by heating and/or by blowing with a gas jet.

The separating unit MDU11 may be arranged to mechanically separate the transponder 100 from an outer portion OR1 and/or from a residual portion 10e.

The manufacturing apparatus 200 may comprise an RF performance monitor MDU12 (radio frequency performance monitor) for monitoring RF performance of the RFID transponders. If deviation from ideal performance is detected, the control unit 400 of the apparatus 200 may be configured to adjust one or more process parameters PAR1 such that optimum performance may be attained.

The control (i.e. RF tuning) may be carried out on-line. The trajectory of the laser beam LB1 may be controlled based on feedback. Feedback for controlling processing a present transponder may be obtained by measuring a property of a previously processed transponder. In other words, the position of an antenna element a first RFID transponder may be selected (by locally removing the mask by a laser beam and by subsequent etching) based on information obtained from a second RFID transponder.

The testing unit MDU12 may be arranged to measure the radio frequency performance of the transponder after the etching. The control unit 400 may be arranged to provide statistical performance data based on information provided by the testing unit MDU12. The control unit 400 may be arranged to provide statistical performance data associated with a manufacturing batch.

The tuning unit MDU13 may be arranged to change an operating parameter of the transponder based on the measured radio frequency performance of the transponder. In particular, the tuning unit MDU13 may comprise a laser, which is arranged to change a dimension of an antenna element 10a, 10b, CA1 based on measured radio frequency performance of the transponder 100. The tuning unit MDU13 may be arranged to provide a laser beam, which removes material from an antenna element by laser cutting. The tuning may be carried out after the etching. The tuning may be carried out based on a signal obtained from the testing unit MDU12.

The laminating unit MDU14 may be arranged to attach the transponder to one or more carrier sheets 81, 82.

The conductive sheet may be pre-coated such that one or both covering units MDU2, MDU4 may be omitted.

The same covering unit MDU2 or MDU4 may apply both mask layers M1, M2.

The contact region uncovering unit MDU3 may be omitted if the chip 50 is bonded to a surface of the conductive sheet 70, which is already bare.

The apparatus 200 does not need to comprise the preliminary groove forming unit MDU1 if at least one processing laser beam LB1 is on a different side of the conductive sheet 70 than the chip 50.

Semi-manufactured transponders 100S may also be provided e.g. as pre-fabricated rolls or sheets, which comprise RFID chips 50 attached to the conductive sheet 70, wherein the sheet 70 is already covered with one or two mask layers M1, M2. Thus, one or more of the units MDU1, MDU2, MDU3, MDU4, MDU5 may also be remote from the apparatus 200. The apparatus 200 does not need to comprise one or more of the units MDU1, MDU2, MDU3, MDU4, MDU5.

The washing unit MDU9 and/or the drying unit MDU10 may be omitted if the corrosive and/or impedance-changing effect of residual etching substance and/or washing liquid can be tolerated.

The separating unit MDU11 may be omitted e.g. if the outer portion OR1 and/or residual portion 10e are removed already during the etching. The separating unit MDU11 may be omitted if the outer portion OR1 and/or residual portion 10e do not significantly degrade the radio frequency performance of the transponder. The separating unit MDU11 may be omitted if the antenna elements are formed in such a way that the outer portion OR1 and/or residual portion 10e are not formed.

The testing unit MDU12 and/or the tuning unit MDU13 may be omitted if it is likely that the radio frequency performance of the transponder 100 already fulfills predetermined radio frequency performance specifications without additional tuning.

The laminating unit MDU14 may be omitted e.g. if the transponder 100 is used and/or stored as a substrateless transponder.

Various aspects are illustrated by the following examples:

Example 1

A method for producing a radio frequency identification transponder (100), the transponder (100) comprising a radio frequency identification chip (50) and one or more antenna elements (10a, 10b, CA1), the method comprising:

providing a conductive sheet (70) covered by a mask layer (M1, M2), processing the mask layer (M1) by a laser beam (LB1) so as to form a processed portion (U1,U2) of the conductive sheet (70), wherein said processing is carried out after the radio frequency identification chip (50) has been attached to the conductive sheet (70), and etching (ETCH1) said processed portion (U1,U2) so as to form a groove (C1,C2) in the conductive sheet (70), wherein said groove (C1,C2) defines the position of an edge of an antenna element (10a) of the transponder (100).

Example 2

The method of example 1 comprising monitoring the position of the chip (50), and selecting the location of the processed portion (U1,U2) based on detected position of the chip (50).

Example 3

The method of example 1 or 2 comprising covering the conductive sheet (70) with a mask layer (M2) after the chip (50) has been attached to the conductive sheet (70).

Example 4

The method of example 1 or 2, wherein a first side of the conductive sheet (70) has been covered with a first mask layer (M1) before the chip (50) is attached to the conductive sheet (70), and wherein a second side of the conductive sheet (70) has been covered with a second mask layer (M2) before the chip (50) is attached to the conductive sheet (70).

Example 5

The method of example 4 comprising locally removing a mask layer (M1, M2) from a portion (U52) contacting with a connecting element (52a, 52b) of the chip (50).

Example 6

The method according to any of the examples 1 to 5 wherein the laser beam (LB1) and the chip (50) are on different sides of the conductive sheet (70).

Example 7

The method according to any of the examples 1 to 5 wherein the laser beam (LB1) and the chip (50) are on the same side of the conductive sheet (70).

Example 8

The method according to any of the examples 1 to 7 wherein the thickness of a mask layer (M2) and/or the material of the mask layer (M2) has been selected such that the tensile strength of the mask layer (M2) is smaller than the tensile strength of the conductive sheet (70).

Example 9

The method according to any of the examples 1 to 8 wherein the chip (50) is attached to the conductive sheet (70) by an adhesive (ADH1), and the adhesive (ADH1) is also arranged to operate as a protective mask during the etching (ETCH1).

Example 10

The method according to any of the examples 1 to 9 wherein the mask layer (M1, M2) is processed by heating and/or ablating the mask layer (M1) with the energy of the laser beam (LB1) so as to form said processed portion (U1, U2).

Example 11

The method according to any of the examples 1 to 10 wherein the combined area of one or more processed portions (U1,U2) defining the form of an antenna element (10a, 10b, CA1) is smaller than or equal to 50% of the area of said antenna element (10a), advantageously smaller than 20% of the area of said antenna element (10a).

Example 12

An apparatus (200) for producing a radio frequency identification transponder (100), the transponder (100) comprising a radio frequency identification chip (50) and one or more antenna elements (10a, 10b, CA1), the apparatus (200) comprising:

a holder (201, 300) for holding a conductive sheet (70) covered with a mask layer (M1, M2), a laser (250) arranged to form a processed portion (U1,U2) of the conductive sheet (70) by processing said mask layer (M1, M2) with a laser beam (LB1) after the radio frequency identification chip (50) has been attached to the conductive sheet (70), and an etching unit (MDU8) arranged to form a groove (C1,C2) in the conductive sheet (70) by etching said processed portion (U1,U2), wherein said groove (C1,C2) defines an edge of an antenna element (10a) of the transponder (100).

Example 13

The apparatus (200) of example 12 comprising a monitoring unit (MDU7) arranged to detect the position of the chip (50), wherein the apparatus (200) is arranged to form the processed portion (U1,U2) to a position which is determined according to the detected position of the chip (50).

Example 14

The apparatus (200) of example 12 or 13 comprising a chip holder (260) arranged to attach the chip (50) to the conductive sheet (70).

Example 15

The apparatus (200) according to any of the examples 12 to 14 comprising a coating unit (MDU2, MDU5) arranged to coat the conductive sheet (70) with a mask layer (M1, M2).

Example 16

The apparatus (200) according to any of the examples 12 to 15 wherein the laser beam (LB1) and the chip (50) are on different sides of the conductive sheet (70).

Example 17

The apparatus (200) according to any of the examples 12 to 16 comprising a laminating unit (MDU14) arranged to form a radio frequency identification tag or inlay (110) by combining the transponder (100) with a carrier sheet (81, 82).

For the person skilled in the art, it will be clear that modifications and variations of the devices and the methods according to the present invention are perceivable. The drawings are schematic. The particular embodiments described above with reference to the accompanying drawings are illustrative only and not meant to limit the scope of the invention, which is defined by the appended claims.

The invention claimed is:

1. A method for producing a radio frequency identification transponder, the transponder comprising a radio frequency identification chip and one or more antenna elements, the method comprising:

providing a conductive sheet covered by a mask layer, processing the mask layer by a laser beam so as to form a processed portion of the conductive sheet, wherein said processing is carried out after the radio frequency identification chip has been attached to the conductive sheet, and etching said processed portion so as to form a groove in the conductive sheet, wherein said groove defines the position of an edge of an antenna element of the transponder, wherein a first side of the conductive sheet has been covered with a first mask layer before the chip is attached to the conductive sheet, and wherein a second side of the conductive sheet has been covered with a second mask layer before the chip is attached to the conductive sheet.

2. The method of claim 1, comprising locally removing a mask layer from a portion contacting with a connecting element of the chip.

3. The method according to claim 1, wherein the laser beam and the chip are on different sides of the conductive sheet.

4. The method according to claim 1, wherein the chip is attached to the conductive sheet by an adhesive, and the adhesive is also arranged to operate as a protective mask during the etching.

5. The method according to claim 1, wherein the mask layer is processed by heating and/or ablating the mask layer with the energy of the laser beam so as to form said processed portion.

6. The method according to claim 1, wherein the combined area of one or more processed portions defining the form of an antenna element is smaller than or equal to 50% of the area of said antenna element.

7. The method of claim 1 comprising monitoring the position of the chip, and selecting the location of the processed portion based on a detected position of the chip.

8. The method of claim 1 wherein the laser beam and the chip are on the same side of the conductive sheet.

9. The method of claim 1 wherein the thickness of a mask layer has been selected such that the tensile strength of the mask layer is smaller than the tensile strength of the conductive sheet.

10. The method according to claim 1 wherein the mask layer is processed by at least one of heating with the energy of the laser beam or ablating the mask layer with the energy of the laser beam so as to form said processed portion.

11. The method according to claim 1 wherein the combined area of one or more processed portions defining the form of an antenna element is smaller than or equal to 50% of the area of said antenna element.

12. A method for producing a radio frequency identification transponder, the transponder comprising a radio frequency identification chip and one or more antenna elements, the method comprising:

providing a conductive sheet covered by a mask layer, processing the mask layer by a laser beam so as to form a processed portion of the conductive sheet, wherein said processing is carried out after the radio frequency identification chip has been attached to the conductive sheet, and etching said processed portion so as to form a groove in the conductive sheet, wherein said groove defines the position of an edge of an antenna element of the transponder, wherein the laser beam and the chip are on the same side of the conductive sheet.

13. A method for producing a radio frequency identification transponder, the transponder comprising a radio frequency identification chip and one or more antenna elements, the method comprising:

providing a conductive sheet covered by a mask layer, processing the mask layer by a laser beam so as to form a processed portion of the conductive sheet, wherein said processing is carried out after the radio frequency identification chip has been attached to the conductive sheet, and etching said processed portion so as to form a groove in the conductive sheet, wherein said groove defines the position of an edge of an antenna element of the transponder wherein the thickness of a mask layer has been selected such that the tensile strength of the mask layer is smaller than the tensile strength of the conductive sheet.

14. The method of claim 13 comprising monitoring the position of the chip, and selecting the location of the processed portion based on a detected position of the chip.

15. The method of claim 13 comprising covering the conductive sheet with a mask layer after the chip has been attached to the conductive sheet.

16. The method of claim 13 comprising locally removing a mask layer from a portion contacting with a connecting element of the chip.

17. The method of claim 13 wherein the laser beam and the chip are on the same side of the conductive sheet.

18. The method according to claim 13 wherein the laser beam and the chip are on different sides of the conductive sheet.

19. The method according to claim 13 wherein the mask layer is processed by at least one of heating with the energy of the laser beam or ablating the mask layer with the energy of the laser beam so as to form said processed portion.

20. The method according to claim 13 wherein the combined area of one or more processed portions defining the form of an antenna element is smaller than or equal to 50% of the area of said antenna element.

* * * * *